United States Patent [19]
Holland et al.

[11] Patent Number: 5,455,934
[45] Date of Patent: * Oct. 3, 1995

[54] FAULT TOLERANT HARD DISK ARRAY CONTROLLER

[75] Inventors: Alexander Holland; Peter G. Vavaroutsos, both of San Jose, Calif.

[73] Assignee: Eclipse Technologies, Inc., San Jose, Calif.

[*] Notice: The portion of the term of this patent subsequent to Nov. 22, 2011 has been disclaimed.

[21] Appl. No.: 212,494

[22] Filed: Mar. 11, 1994

Related U.S. Application Data

[63] Continuation-in-part of Ser. No. 35,410, Mar. 23, 1993, Pat. No. 5,367,669.

[51] Int. Cl.[6] ............................................. G06F 11/00
[52] U.S. Cl. .................. 395/404; 395/441; 395/182.04; 395/419
[58] Field of Search ...................... 395/575, 425; 371/10.1

[56] References Cited

U.S. PATENT DOCUMENTS

| | | | |
|---|---|---|---|
| 5,101,492 | 3/1992 | Schultz et al. | 395/575 |
| 5,148,432 | 9/1992 | Gordon et al. | 321/10.1 |
| 5,155,835 | 10/1992 | Belsan | 395/425 |
| 5,163,131 | 11/1992 | Row et al. | 395/200 |
| 5,367,669 | 11/1994 | Holland et al. | 395/375 |

OTHER PUBLICATIONS

David A. Patterson et al., "A case for Redundant Arrays of Inexpensive Disks (RAID)," Report No. UCB/CSD 87/391, Computer Science Division (EECS), pp. 1–24 (Dec. 1987).

*Primary Examiner*—Robert W. Beausoliel, Jr.
*Assistant Examiner*—Jospeh E. Palys
*Attorney, Agent, or Firm*—Blakely, Sokoloff, Taylor & Zafman

[57] ABSTRACT

The disk array control system is a fault tolerant controller for arrays of hard disk drives. With the controller as a front end, an array of hard disk drives would appear as a single drive to a host computer system connected to the controller. The controller translates input/output data transfer requests from the host system to input/output data transfer requests for the appropriate drives in the drive array. To minimize latency, translation techniques provide for a minimal number of accesses to the drives in the array. Queued input/output requests are supported, and, to maximize throughput, optimal scheduling techniques are used to optimize resource usage and minimize drive access overheads. Means are provided for detecting module failures, sustaining operation after failure, and replacing faulty modules without interrupting service.

26 Claims, 12 Drawing Sheets

```
RAID4Map( LogicalAddr, NumBlocks, NumStripeBlks ) {
    Adjust(LogicalAddr, NumBlocks, NumStripeBlks); // Eq. 9.
    RemainingBlocks = NumBlocks;
    ChannelsFirstRank = YES; i = 0;

Channel = GetChannel(LogicalAddr); // Eq. 4.
    while( RemainingBlocks > 0) {
        if(ChannelsFirstRank == YES) { // Map 1st rank of drives.
            Rank[i] = GetRank(LogicalAddr); // Eq. 5.
            TotalLength[i] = 0; // Eq. 6 and eq.7.
            DriveAddr = GetDriveAddr(LogicalAddr, Channel, Rank[i]);
            Length = GetLength(DriveAddr, i, TotalLength, Rank[i], NumBlocks);
            if(i == 0) // Eq. 10.
                DriveAddr = DriveAddr + (DriveAddr mod NumStripeBlks);
            UpdateDriveRequestList(Channel, Rank[i], DriveAddr, Length);
            TotalLength[i] = Length; LogicalAddr = LogicalAddr + 1;
        } else {
            DriveAddr = 0; // Eq. 8.
            Length = GetLength(DriveAddr, i, TotalLength, Rank[i], NumBlocks);
            UpdateDriveRequestList(Channel, Rank[i], DriveAddr, Length);
            TotalLength[i] = TotalLength[i] + Length;
        }
        Rank[i] = Rank[i] + 1;
        RemainingBlocks = RemainingBlocks - Length; i = i + 1;
        if(i == NUM_OF_CHANNELS) {
            ChannelsFirstRank = NO; i = 0;
        }
        Channel = (Channel + 1) modC
    }
    i = (i + C - 1) mod C; // Eq. 11.
    AdjustLastRequestLength(Channel, Rank[i]-1, DriveAddr, Length, NumStripeBlks);
}
```

*Figure 5*

```
RAID5Map(LogicalAddr, NumBlocks, NumStripeBlks) {
    NumBlocks = AdjustNumBlocks(LogicalAddr, NumBlocks); // Eq. 14.
    LogicalAddr = AdjustLogicalAddr(LogicalAddr); // Eq. 14.
    RAID4Map(LogicalAddr, NumBlocks, NumStripeBlks);
}
```

*Figure 6*

```
RAID3Map( LogicalAddr, NumBlocks) {
    RemainingBlocks = NumBlocks;
    FirstRank = YES;
    while( RemainingBlocks > 0) {
        if(FirstRank == YES) { // Map 1st rank of drives.
            FirstRank = NO;
            Rank = GetRank(LogicalAddr); // Eq. 16.
            TotalLength = 0; // Eq.17 and eq.18.
            DriveAddr = GetDriveAddr(LogicalAddr, Rank);
            Length = GetLength(DriveAddr, TotalLength, Rank, NumBlocks);
            Foreach Channel
                UpdateDriveRequestList(Rank, DriveAddr, Length);
            TotalLength= Length;
        } else {
            DriveAddr = 0; // Eq. 19.
            Length = GetLength(DriveAddr, TotalLength, Rank, NumBlocks);
            Foreach Channel
                UpdateDriveRequestList(Rank, DriveAddr, Length);
            TotalLength = TotalLength + Length;
        }
        RemainingBlocks = RemainingBlocks - Length;
        Rank = Rank + 1;
    }
}
```

*Figure 7*

```
RAID1Map(LogicalAddr, NumBlocks, NumStripeBlks) {
    RAID4Map(LogicalAddr, NumBlocks, NumStripeBlks, DRIVE_ARRAY0 );
    RAID4Map(LogicalAddr, NumBlocks, NumStripeBlks, DRIVE_ARRAY1 );
}
```

*Figure 8*

```
RAID35Map(LogicalAddr, NumBlocks, NumStripeBlks) {
     RAID3Map(LogicalAddr, NumBlocks, DRIVE_ARRAY0);
     RAID5Map(LogicalAddr, NumBlocks, NumStripeBlks, DRIVE_ARRAY1);
}
```

(a)

```
RAID33Map(LogicalAddr, NumBlocks) {
     RAID3Map(LogicalAddr, NumBlocks, DRIVE_ARRAY0);
     RAID3Map(Logical Addr, NumBlocks, DRIVE_ARRAY1);
}
```

```
RAID2D5Map(LogicalAddr, NumBlocks, NumStripeBlks) {
    AdjustChannelAndRank(C, R); // Eq. 20.
    RAID5Map(LogicalAddr, NumBlocks, NumStripeBlks);
    ModifyMappedChannelsAndRanks(); // Eq. 21.
}

RAID2D4Map(LogicalAddr, NumBlocks, NumStripeBlks) {
    AdjustChannelAndRank(C, R); // Eq. 20.
    RAID4Map(LogicalAddr, NumBlocks, NumStripeBlks);
    ModifyMappedChannelsAndRanks(); // Eq. 21.
}
```

*Figure 10*

FAULT TOLERANT HARD DISK ARRAY CONTROLLER

CROSS-REFERENCE TO EARLIER FILED APPLICATION

This application is a continuation-in-part of application Ser. No. 08/035,410, filed Mar. 23, 1993 now issued U.S. Pat. No. 5,367,669 dated Nov. 22, 1994.

FIELD OF THE INVENTION

The invention pertains to the field of fault tolerant controllers for arrays of hard disk drives for computer systems. More specifically it pertains to the management of information storage and retrieval on such arrays using modern control theory, including data partitioning techniques, scheduling techniques for queued input/output data requests, and recovery techniques in the event of drive and other component failures.

BACKGROUND OF THE INVENTION

Redundant Arrays of Inexpensive Disks (RAID) systems are now being offered commercially as cost effective mass storage providing reliable and continuous service to a host computer or network file server. These arrays of hard disk drives are managed by a (hardware or software) controller to appear to the host system as a single drive having a large contiguous set of "logical" data blocks. A typical input/output (I/O) request from the host computer is serviced by transfering the appropriate data in the proper order from one or more of the physical drives in the array. The goal is to select the physical array structure and to map the logical data blocks to the physical drives in a manner that provides fault tolerance to drive failures and that facilitates efficient data transfer rates. Redundant data or parity data is used to recover data that is lost when a drive fails.

Several storage formats, termed "RAID levels", for byte or block striping data across the drives have become popular—e.g. RAID-4 (block striped with or without a parity drive), RAID-1 (mirrored block data), RAID-3 (byte striped with a parity drive), and RAID-5 (block striped with parity blocks distributed on all drives). See "A Case for Redundant Arrays of Inexpensive Disks (RAID)", by David A. Patterson et. al., University of California Berkeley, Report No. UCB/CSD 87/391, December 1987. Data security require and typical data access characteristics determines which of these formats is most suitable for a particular application environment. For example, an environment requiring fault tolerance to drive failure, but with typical accesses consisting of large blocks of contiguous data may be better supported by RAID-3, while one with typical accesses consisting of random small blocks of data may be better supported by RAID-5.

In handling single data access requests from a host system, current RAID control systems incur significant added latency due to the drive array access methods used, and, in handling multiple queued data access requests, they incur reduced throughput due to the scheduling methods used or even the lack of scheduling. The present invention includes innovations to optimize access latency and throughput for single or multiple queued access requests. Due to architectural design, current control systems also have limited, high cost, and complex methods for fault tolerance and expansion. The present invention introduces architectural innovations that reduce cost and complexity.

SUMMARY OF THE INVENTION

The present invention is a fault tolerant controller for arrays of hard disk drives comprising: (1) means for translating I/O data access requests from a host system to I/O requests for the appropriate hard disk drives, (2) means for scheduling order of execution and executing multiple I/O requests in parallel, (3) means for monitoring system operation and automatically diagnosing faulty components, (4) means for sustaining operation after certain component failures, (5) means for replacing certain faulty components without interrupting the operation of the system, (6) means for modular system expansion, and (7) means for coordinating all of the system functions and resources.

One object of the invention is improved I/O throughput and reduced latency over previous systems. New optimal techniques are developed for generating RAID formats on drive arrays of arbitrary dimensions. They allow for the physical array to be partitioned into multiple arrays of physical drive data partitions that exist simultaneously on the physical drive array. Each of these data partition arrays may have different RAID formats, and and they may have nested RAID formats, such as a RAID-1 (mirrored) array with RAID-5 format on each of the mirrored halves. When translating an I/O request from the host computer to I/O operations on the physical drives, the techniques minimize bus arbitration, selection, message passing, seek, and access latency overheads.

New techniques are also developed for scheduling the execution of multiple I/O requests so that a desired performance criterion is optimized, while maximum I/O latency of any single transfer request remains bounded (i.e. service of a request is not delayed indefinitely). One embodiment of the optimized scheduling allows the the use of efficient linear programming methods. Throughput is also improved because I/O requests that are not using the same drive resources are detected and are subsequently executed in parallel.

Another object of the invention is to provide tolerance to failure of key system modules such as disk drives, power supplies, fans, and system hardware controllers. System cost and complexity are reduced by novel approaches for detecting module failures and for module replacement without interrupting operation of the system.

A further object is to achieve a more cost effective, modular, and expandable hardware and software architecture having better utility than past systems.

FIG. 1 shows the system control hardware 20 and system control software 30 block diagram of a single unit of the system. The system is designed to be modularly expandable into multiple units as illustrated in FIG. 2. Each unit contains a set of drives and expansion ports that are extensions of the drive busses in the Hard Disk Drive Array 12. However, the simple addition of disk drives using the expansion ports and expansion units, do not require additional RAID Controllers 8. The central software modules are Real Time Kernel 14 and I/O Process Manager 19, while the central hardware module is RAID Controller 8. Hard Disk Drive Array 12 is a set of commercially available hard disk drives connected to several drive channel busses and managed by the rest of the system to appear to Host Computer 7 as one or more large capacity hard disk drives (see FIG. 4). The system manages the Hard Disk Drive Array 12 so that it continues to function in the event of failure of some of the drives. Each drive in 12 is individually replaceable without powering down the system. Fans and Power Supplies 11 are hardware modules that are individually monitored, optionally redundunt, and individually replaceable without powering down the system.

RAID Controller 8 is hardware consisting of an embedded microprocessor and special purpose data routing hardware that channels data back and forth between the Hard Disk Drive Array 12 and Host Computer 7 (see FIG. 3). The embedded processor is used to initialize and manage the remaining hardware components. Most of the system software runs on this controller, the only exception being some health monitoring and diagnostic software running on System Fault Monitor 9. Although not required for a basic configuration, Controller 8 is designed so that several may operate in the system simultaneously for additional performance or for system tolerance of controller is failure. Because the data bus channels in Hard Disk Drive Array 12 are idle while drive heads are seeking, two controllers can achieve near double the throughput of a single controller if they are accessing data on mutually exclusive physical drives, and additional controllers increase throughput proportionately under similar conditions. Controller 8 is also designed so that additional controllers can function as backup controllers in the event that the primary controller fails to function, and the faulty controller can be replaced without powering down the system.

System Fault Monitor 9 is hardware that monitors the health and status of Fans and Power Supplies 11 of a single system unit. It also controls status indicators on drives in Hard Disk Drive Array 12 that visually report the status (e.g. good, bad, off, on, etc.) of the individual drives. Status data is communicated to the primary RAID controllers using the system Serial Bus. Each expansion unit would also contain System Fault Monitor 9.

In prior art systems, status monitoring hardware is part of system control hardware, and any existing expansion units would require extra wires carrying status and fault data for that unit's fans, drives, and power supplies to flow to each unit containing control hardware. This creates significant extra cost and complexity. According to the present invention, only a single multi-master serial bus carrying fault and status information flows between the the expansion units and the units with RAID Controller 8, regardless of the number of expansion units or the number of units with RAID Controller 8.

Alarm Controller 10 consists of relays that are programmable as normally open or normally closed. The state of the relays is changed in the event that a system fault is detected. External signals can be connected to these relays so that an alarm is triggered when any failure of any module in the system is detected.

Serial Port Controllers 13 consist of hardware that controls multiple serial ports to allow simultaneous communication with several external devices. Real Time Kernel 14 provides software drivers for these ports. During test or repair, a serial port driver is used by System Diagnostics Manager 17 and Kernel Debugger/System Monitor 15 to communicate system status to an external computer. This module can be used by the host computer to read or write all system memory and registers, single step code execution, set break points, and perform other debugging functions. Real Time Kernel 14 also contains in boot-up code a lower level monitor/debugger that operates from read-only-memory (ROM) using only processor registers, i.e. it does not require functional system dynamic-random-access-memory (DRAM).

Direct communication with software running on System Fault Monitor 9 is also supported. Under normal field operation, the System Diagnostics Manager 17 is designed to use the serial communications ports to communicate with external AC power monitoring devices and with a modem. The idea is that if AC power has been externally interrupted (but perhaps temporarily supplied by an external device), the system is informed and can shut down gracefully in the event that power does not return within a prescribed time limit. The controller system can also use a modem to dial and inform a remote location of a module failure, or a remote location can use the modem to download to the system a new version of certain software modules. Multiple RAID Controllers 8 can share serial ports. System Fault Monitor 9 may optionally share serial communications ports or have its own.

Real Time Kernel 14 is an operating system component that provides an abstract interface to system hardware 20 allowing major software modules to be constructed as independent tasks or procedures. It provides task creation services, task scheduling services, task communication services, memory management services, hardware driver software, interrupt service routines (ISRs), and other utilities that are used to keep the detailed nature of the hardware transparent to the software and to keep the detailed nature of each software module transparent to other modules. The kernel adds significant flexibility to the system. Extensive modifications in the priorities and order of module execution can easily be made from within it without extensive modifications of these modules, and major blocks of hardware or modules of software can be added or changed in the disk array controller system without affecting the rest of the system. Only the kernel may need significant modifications in the case of major hardware changes. The cost of product maintenance and evolution is thereby reduced.

Host Interface Manager 16 is a software module that provides a high level interface to the control hardware in RAID Controller 8 that interfaces to the host computer bus. Low level host communication protocol is encapsulated in this module. The module makes use of a software driver supplied by Real Time Kernel 14 that controls host interface hardware in Raid Controller 8. When the hard disk array controller system is selected by a Host Computer 7 for an I/O operation, an I/O process (IOP) is established in the controller system containing the host's I/O command or request. The IOP exists as an instance of a software data structure that instigates a series of events in the controller system that depend on the host command received. For example, a READ command would result in an appropriate configuration of hardware data paths in 8 and in READ commands being generated for the appropriate drives in Hard Disk Drive Array 12. Additional complexity arises because the controller system may disconnect from the host bus and later reconnect to complete the READ transfer. Meanwhile, new IOP's may be established, queued, and executed in parallel. Thus the IOP is a fundamental software object in the system managed by I/0 Process Manager 19.

I/0 Process Manager 19 decodes the IOP, performs logical to physical address translations if necessary, schedules the IOP for execution, and attaches IOPs at the top of the sheduling queue to available IOP executor tasks. An IOP executor task manages an IOP's complete execution, and a user selectable number of IOP executor tasks can operate in parallel. Each task uses services provided by Data Path Manager 18 for an IOP that calls for access to Hard Disk Drive Array 12, and each task uses services provided by Host Interface Manager 16 to communicate with the host computer.

Novel optimal techniques for address translation are independent of the number of drive channels and number of drives per channel. This means that the techniques will work on "logical" subarrays of the Hard Disk Drive Array 12. A logical subarray is an array of "logical drives", where a logical drive is a data partition on a physical drive. Since a physical drive can is be partitioned into multiple independent data partitions, the physical drive array can be partitioned into multiple logical subarrays by software, each supporting different RAID formats. A logical drive could also consist of a noncontiguous set of physical drive data partitions. The logical subarrays may have rank and channel dimensions exceeding that of the physical array, or dimensions smaller than the physical array. Certain kinds of RAID format nesting is also possible, such as a RAID-1 (mirrored) array with RAID-5 format on each of the mirrored halves. The techniques minimize bus arbitration, selection, message passing, seek, and access latency overheads.

When host commands allow flexibility in sorting queued IOP's, new optimal techniques for performing the sorting are used. The sorting methods employ modern control techniques for sorting that optimizes a performance measuring function. Parameters in this function are dynamically modified to guarantee that the maximum I/O latency of any single transfer request remains bounded. A "resource vector" is introduced to track the usage of drive channels and other shared resources in Hard Disk Drive Array 12. Computationally efficient arithmetic is used to detect IOP's that are able to execute in parallel and the optimizing sort of the IOP's includes the detected parallelism. Execution constraints that are explicit in the host command are also maintained.

Data Path Manager 18 provides a high level interface to data path hardware in RAID Controller 8. Low level communication protocol used with Hard Disk Drive Array 12 is encapsulated in this module. The module makes frequent use of a software driver supplied by Real Time Kernel 14 that controls drive array interface and data path control hardware in RAID Controller 8.

System Diagnostics Manager 17 manages the system's responses to fault conditions. It communicates via the serial bus with the System Fault Monitor 9 to periodically update system data structures containing the status of various hardware modules, such as fans, power supplies, drives, and controller boards. In the event of failure of a RAID Controller 8, it handles the transition of control to the redundant controller. It also initiates and manages other system events in response to other types of system faults. For example, if a drive has failed, it may change the state of an alarm relay and send a message to a remote location via a modem attached to the serial port. It also manages tasks such as the reconstruction of data on a new drive inserted to replace a failed drive.

Kernel Debugger and System Monitor 15 provides functions such as unrestricted access to read and write all memory and registers and the ability to set code execution break points. Higher level commands are also provided that, for example, read and display status data of system queues, tasks, task log buffers, and hardware units. Task execution activity is readily assessed because tasks regularly post error and status messages to an internal log buffer which can be read from a serial port using this module. The kernel can also be set up to automatically transmit log buffer messages.

BRIEF DESCRIPTION OF THE DRAWINGS

FIG. 5 is the pseudo-code for a RAID-4 mapping procedure.

FIG. 6 is the pseudo-code for RAID-5 mapping procedure.

FIG. 7 is the pseudo-code for a RAID-3 mapping procedure.

FIG. 8 is the pseudo-code for RAID-1 mapping procedure.

FIG. 9 is the pseudo-code for examples of nested RAID format mapping procedures.

FIG. 10 is the pseudo-code for RAID-5 and RAID-4 two dimensional block stripping mapping procedures.

FIG. 11 is a plan view diagram of a single platter internal to a typical hard disk drive.

DETAILED DESCRIPTION OF THE INVENTION

Figure 1:
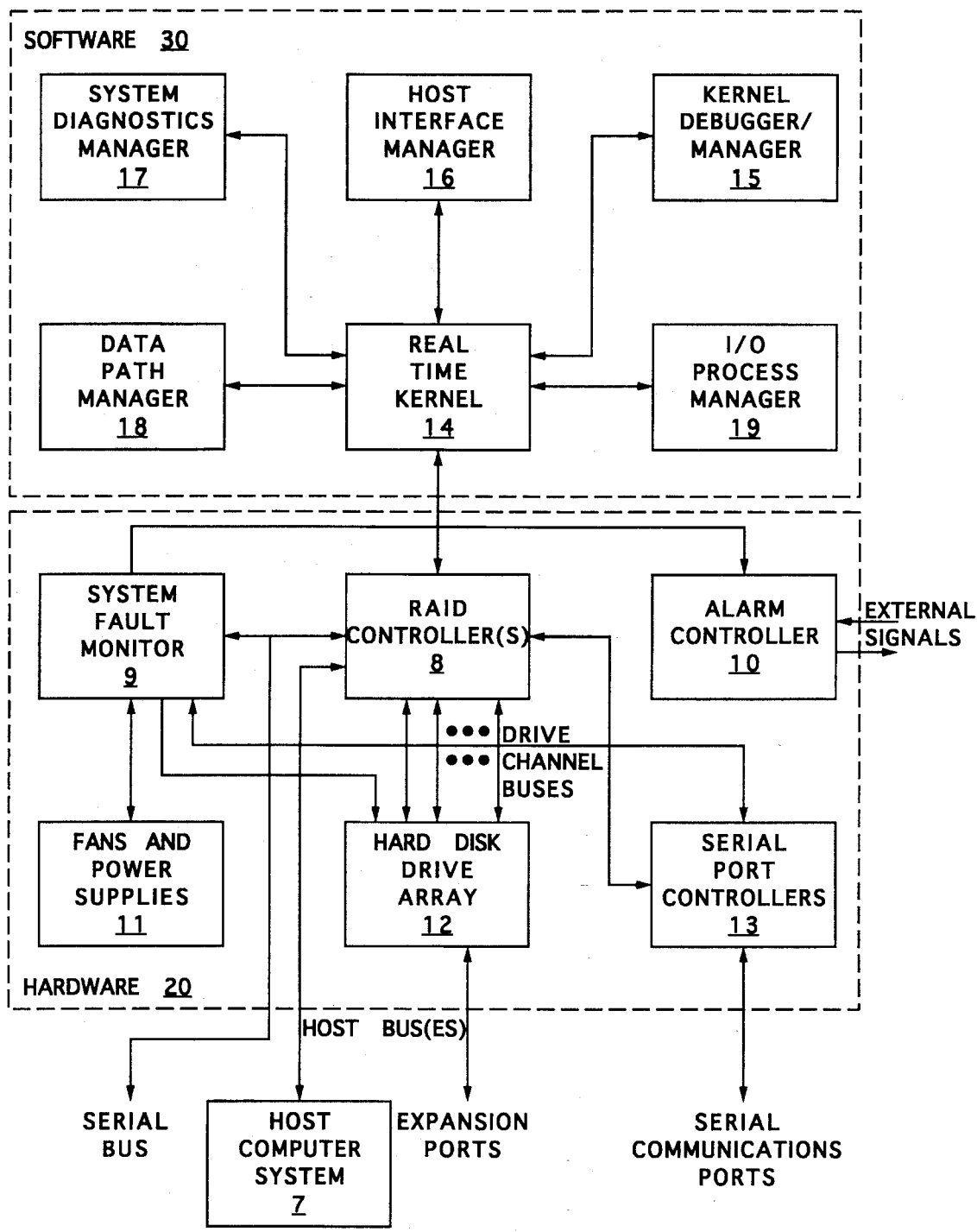
FIG. 1 is a system hardware and software block of the diagram of the hard disk array controller.
Figure 2:
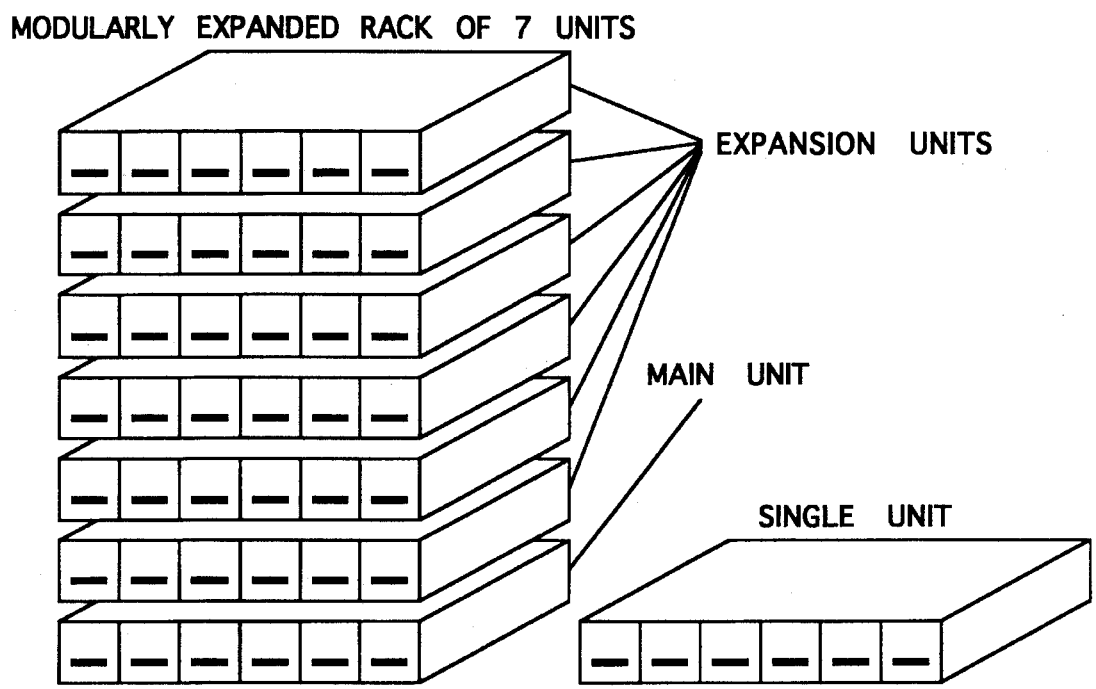
FIG. 2 illustrates the expansion of a single chassis into a system with multiple expansion chassis.

For efficient system cost/performance, the preferred embodiment for hardware 20 of FIG. 1 includes a general purpose microprocessor within RAID Controller 8 that has standard interrupt control, memory, and communications peripherals, together with special purpose data path hardware for coupling Host Computer 7 and Hard Disk Drive Array 12. With present technology, this combination has low cost and supports a new standard of performance by using commercially available VLSI components to form the heart of the data path, and by using a single high performance processor designed for embedded control applications and having a reduced instruction set computer (RISC) architecture. One such processor is the Fujitsu MB86930 which comes with various standard microprocessor peripherals in the MB86940 companion chip (Fujitsu Microelectronics, Inc. 77 Rio Robles, San Jose, Calif. 95134-1807, 1-800-523-0034).

Figure 3:
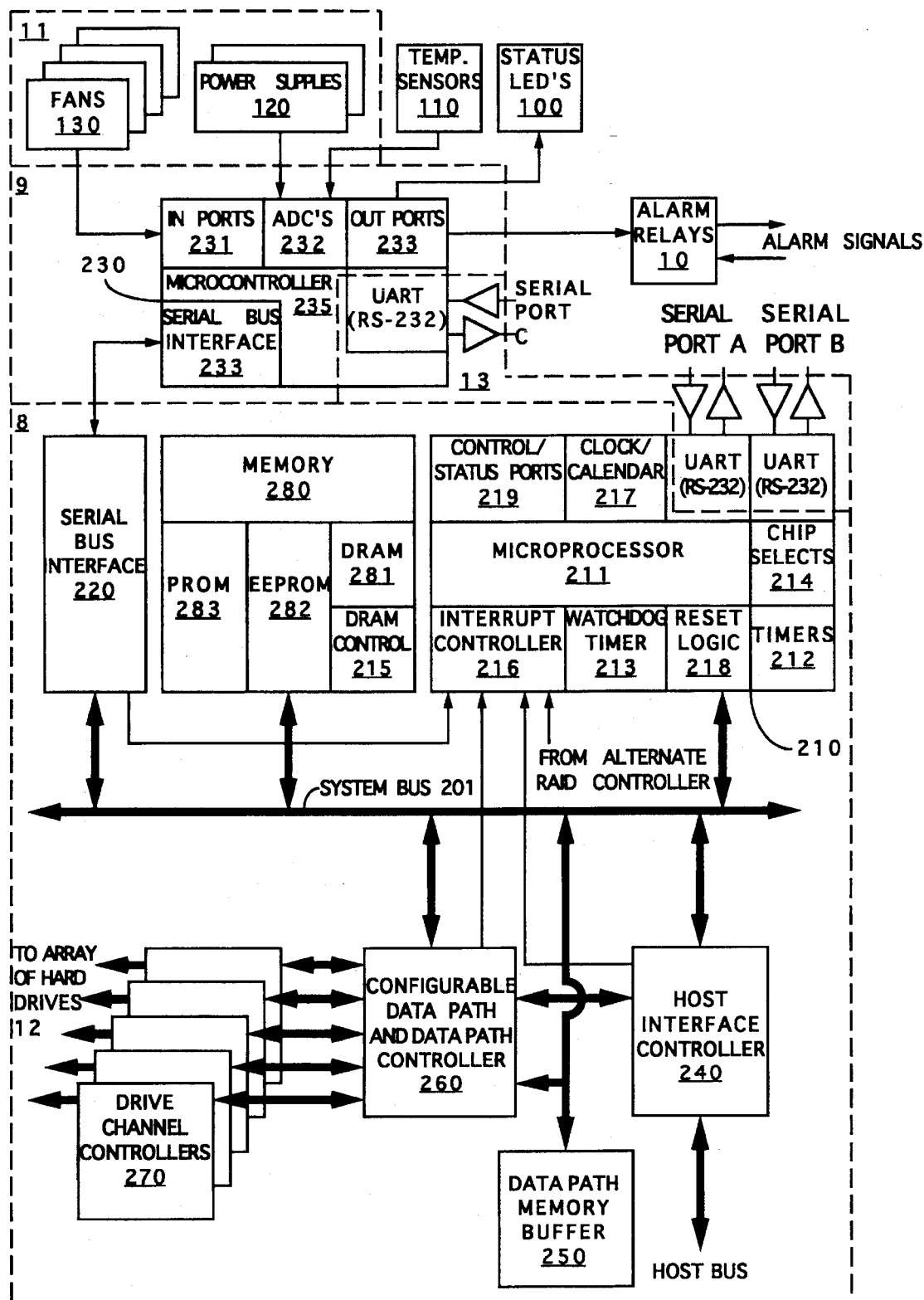
FIG. 3 is a more detailed system hardware block diagram.

An architectural block diagram of a preferred embodiment of hardware 20 is illustrated in FIG. 3. The components of the block diagram comprise:

Microprocessor System 210: This module is the main component of RAID Controller 8 and contains Microprocessor 211 and standard microprocessor peripherals. Interrupt controller 216 provides a scheme for prioritization and vectoring of interrupt requests. The microprocessor receives interrupts from Serial Bus Interface 220, Serial Ports 13, Data Path Controller 260, Real Time Clock/Calendar 217, Timers 212, Electrically Erasable PROM (EEPROM) 282 ready signal, and Host Interface Controller 240. Timers 212 are used by Real Time Kernel 14 to time share the hardware resources, by software tasks to wait for, or instigate, events in the future, and possibly by Serial Port Controllers 13 to provide their clock inputs. Clock/Calendar 217 provides day and time information for logging time of occurrence of various system events, such as a failure of a system module. Reset Logic 218 generates reset whenever: (1) power is turned on, (2) a RAID Controller 8 is inserted with power on, (3) an alternate controller generates reset, (4) the host bus generates reset, (5) or the power supply is out of range. All drive array side busses are reset when a controller is inserted with power on. Watchdog Timer 213 detects faulty functioning of the microprocessor. If this timer is not periodically reset by the software, the timer will also generate a microprocessor reset. Programmable Chip Select Units 214 allow software to control the address ranges at which various peripherals are selected. Control/Status Ports 219 includes an encoded write register, a control register, an identification register, and a system status register. In order to change the contents of the encoded write register, a sequence of bytes must be written to it preceding the data byte. This sequence of bytes must not be interrupted by a bus access to any other location. If interrupted, the sequence must be repeated from the beginning. The bits in this register enable and disable critical system functions which should be protected from accidental enabling or disabling by a stray write from software. Some examples are enabling writes to EEPROM 282, enabling/disabling serial communication ports which may propogate alarm signals, and enabling/disabling non-maskable interrupts and other status signals that flow between multiple RAID Controllers 8 in the system. These latter signals are used to transfer control from a faulty controller to a backup controller. The bits in the control register enable and disable less critical system functions, such as DRAM parity checking or a board status light emitting diode (LED). The identification register contains items such as the slot number that RAID Controller 8 is plugged into and a revision number of the hardware. The status register contains various status bits, including parity errors for DRAM 281 memory banks, address error occurred bit, alternate controller status, etc.

System Bus 201: The protocols of this internal bus will largely be determined by the requirements of the particular system microprocessor and the attached peripherals. In one preferred embodiment this bus consists of several closely related busses. One bus is a local bus consisting of address, data, and control lines provided by the microprocessor. A hardware component such as a programmable array logic (PAL) monitors ready lines from the peripherals and generates a ready signal to the processor. A second byte bus consists of latched data buffers and control logic that converts local bus cycles having 1, 2, or 4 data bytes into 1, 2, or 4 cycles respectively on the byte bus, and vice versa. This reduces cost by allowing a 32 bit microprocessor to execute code from a byte wide boot PROM. It also simplifies the perspective from software when 4 byte data types can be directly written to a byte wide peripheral. With control logic, a third byte wide multiplexed address/data bus is created from the local bus to provide a clean interface to byte wide peripherals that require this type of interface.

Serial Bus Interface 220: This module is an interface to a high speed serial bus, such as the I2C bus provided by a Signetics PCD8584 controller (Signetics Corp. 811 East Arques Ave., P.O. Box 3409, Sunnyvale, Calif. 94088-3409). The I2C is a multi-master serial bus that operates at up to 1OO Kbits/sec. The bus is used for module to module communications between modules in the same chassis or modules in expansion chassis. Modules refer to either RAID Controllers 8 or System Fault Monitors 9.

Memory 280: Boot time initialization and bootstrap loading code is stored in PROM or Erasable PROM (EPROM) Memory 283. Certain system configuration parameters, such as RAID format selection, are stored in non-volatile EEPROM 282. System software is loaded into and executes out of DRAM Memory 281. DRAM Control 215 provides DRAM refresh and support for page mode DRAMs.

Host Interface Controller 240: This module controls and manages low level bus protocol with the host. For a wide and fast Small Computer Systems Interface (SCSI, See "Small Computer System Interface -2", American National Standard X3T9.2/86-109.), an off-the-shelf controller, such as an Emulex FAS366 SCSI controller (Emulex Micro Devices, 3545 Harbor Boulevard, Costa Mesa, Calif. 92626, (714) 662-5600), would be the main component for this hardware.

Drive Channel Controllers 270: These modules control and manage low level bus protocol for every drive channel on the Hard Disk Drive Array 12. For a standard Small Computer Systems Interface (SCSI) on these channels, an off-the-Shelf controller, such as an Emulex FAS236 SCSI controller or a National Cash Register NCR53C96 controller (NCR Microelectronics, 1635 Aeroplaza Drive, Colorado Springs, Colo. 80916, (719) 596-5612), are typical choices for the interface hardware for each channel.

Data Path and Data Path Controller 260: This module controls and contains a data path from the drive channels to the host interface. In one preferred low cost option, an off-the-shelf controller, such a National Cash Register NCR53C920 data path chip, provides an unbuffered path between the Drive Channel Controllers 270 and Host Interface Controller 240. Data transfer is done by a series of DMA transfers from the hard drives to the host computer. Data Path Memory Buffer 250 would only be used in the event of crippled accesses, i.e. accesses where one of the drives has failed and data must be recovered from the remaining drives. In a higher cost/higher performance option, Memory Buffer 250 is used to buffer data in each direction, for allowing, in some cases, a greater degree of parallelism. However, buffering large amounts of data may create more difficulty in maintaining data integrity in the event of main system modules failing.

Microcontroller System 230: This module contains Micrcontroller 235 with standard microcontroller peripherals. Typically one of these modules is contained in the main system unit, and one is contained in each expansion unit. This module receives pulses into its digital Inports 231 from Fans 130 indicating rotational frequency of the fans, and it uses analog-to-digital converters (ADCs) 232 to monitor the voltages of Power Supplies 120. It also uses ADCs 232 to monitor input from Temperature Sensors 110 that are located at various points in a single chassis. It also uses digital Outports 233 to enable or disable externally visible Status LEDs 100 for fans, power supplies, and hard disk drives in the chassis. Alarm Relays 10 are designed for externally supplied signals to run through them. They are programmable normally open or normally closed relays, where their state is changed by Microcontroller 235 when faults are detected.

Hard Disk Drive Array 12 consists of a number of physical drive channels, $C_p$, where each drive channel is a data bus shared by a set of $R_p$ physical disk drives. The present invention introduces a new conception of the data storage in this physical array which gives it additional capability over previous systems. Each physical drive in the array is decomposed into multiple data partitions. Physical drive data partitions, not necessarily located in the same physical drive, are grouped to form "logical drives". Each data partition is assigned to one and only one logical drive, which is typically, but not always, composed of only one physical data partition.

With this conception, a logical level of operation becomes possible, where logical drives are grouped to form one or more logical drive arrays of almost arbitrary rank and channel dimensions, all existing on a single physical drive array of sometimes more limited rank and channel dimensions. It also possible for the data partitions of contiguous logical drives to be non-contiguously located anywhere in the physical array.

Significant practical advantage is gained from logical drive arrays. Expensive physical resources can be configured and optimized for multiple applications rather than duplicated for each application. For example, a single rank of physical drives can simultaneously have both a RAID-3 logical rank and a RAID-5 logical rank. This means that one physical rank, rather than two, can be configured to better suit the requirements of two applications whose typical data transfer requests have different characteristics. One may have typical requests calling for the transfer of large numbers of contiguous data blocks, and the other may have typical requests calling for only a small number of contiguous data blocks. Physical resources can also be more effectively utilized. For example, RAID-3 logical ranks can be limited to the outer tracks of physical drives, which makes possible higher sustained data rates in the system because the outer tracks of physical drives have higher sustained data rates than the inner tracks.

Figure 4:
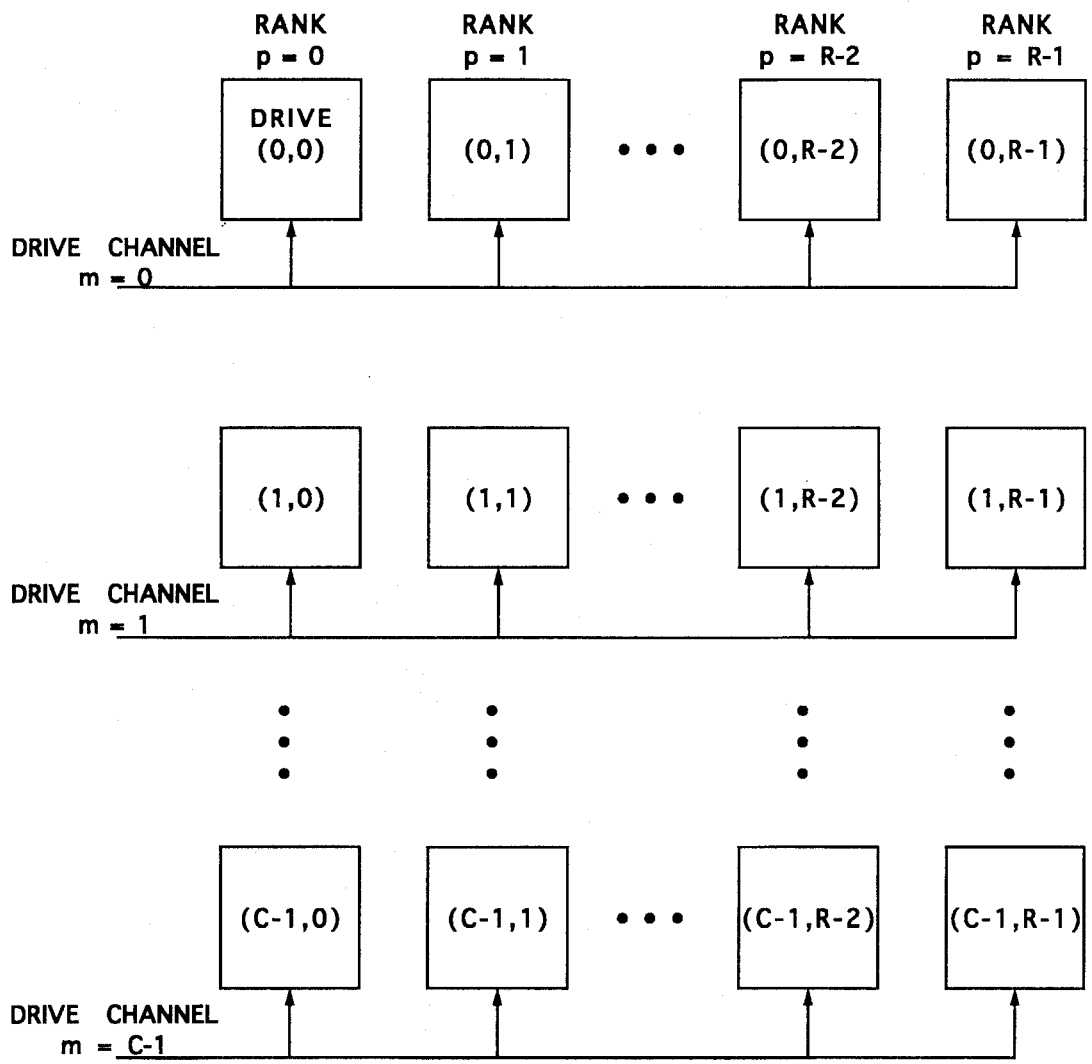
FIG. 4 is a diagram of the basic structure of an array of hard disk drives.

A logical drive array has a number of drive channels, C, where each drive channel, m, is a data bus shared by a set of R disk drives, as shown in FIG. 4. Each drive, $D_{m,p}$, in the array is identified by its indices $$0 \leq m \leq C-1 \quad 0 \leq p \leq R-1$$

The index p is referred to as the "rank" of the drive. For example, the rank 6 drive on channel 4 would have the identification, $D_{4,6}$.

A total of L contiguous logical data blocks are divided among the drives in the array. Each logical block is identified by its address or index, $0 \leq n \leq L-1$. A data transfer consists of a read or write of N logical blocks starting with a particular logical block, n, and ending with the logical block n+N-1 (An overflow, i.e. n+N>L, is treated as an error). The number of bytes in a logical block is a parameter selected when the disk array is formatted (e.g 512 to 8096 bytes), and this number is constrained to be an integer multiple of the number of bytes contained in the typical data block formatted on each drive of the array. Each drive must contain an integer number of the logical blocks. All drives at the same rank, p, contain the same number of logical data blocks, $B_p$. Thus $$L = C \sum_{p=0}^{R-1} B_p$$

A single data I/O transfer request consists of reading or writing $N \leq L$ contiguous logical data blocks starting with block n. The problem is to translate the host logical block addresses to block addresses on the appropriate logical drives. Logical drive to physical drive address translations yield the final physical addresses of the data blocks. These translations are easy. For each logical drive they consist of adding the offset of the physical drive data partition(s) that forms the drive. Then the data must be transferred from each physical drive in the proper order and combined into a single stream of data and routed back to the host requesting the transfer. Other types of I/O requests exist, such as a request to return system status or one to format drives, but these requests are either relatively easy to process or are processed in a manner similar to a read or write request.

As used here, a physical address is still a type of logical address in that it must be translated to a device address by the device driver in Data Path Manager 18 that manages Drive Channel Controllers 270. The particular details of this translation are well known and depend on the specific types of physical drives used and the types of corresponding drive controllers in Drive Channel Controllers 270.

Executing data transfers is the main purpose of the system. Novel techniques detailed below manage and execute I/O transfer requests to minimize the access latency for any single transfer, and they sort queued requests for optimal throughput and minimal latency. The techniques assume typical drive characteristics found for example in common interface standards, such as the Small Computer System Interface (SCSI). Such drives respond to commands such as READ, WRITE, and SEEK (position heads to track with specified address), and issue messages such as DISCONNECT (from the bus) and RECONNECT (to the bus).

First, optimal methods are detailed for mapping data transfer requests from the host computer to requests for the logical (physical) drives involved in the transfer. Drive arrays of arbitrary dimensions are accomodated. This means that the methods will work on multiple logical drive arrays existing simultaneously on Hard Disk Drive Array 12, where each logical drive array can be configured with a different RAID format. They are optimal in the sense that only one READ or WRITE command is issued to each drive involved in an I/O operation, which minimizes arbitration, selection, message passing, seek, and access latency overheads. The method for the RAID-4 format is central. Methods for RAID-1 and RAID-5 employ the RAID-4 method, and the RAID-3 method is closely related to it.

The following mathematical notation and functions are frequently used. For real x and y and integer a and b, $\lfloor x \rfloor$=the greatest integer less than or equal to x;

a mod b=the remainder when a is divided by b;

min(x,y)=the minimum of x or y;

max(x,y)=the maximum of x or y;

Block Striping, Parity Channel (RAID-4):

Block striping allows for parallel accesses of data blocks on each channel. This mapping scheme may optionally reserve a channel to store parity data. With no parity channel, all of the available memory in the array is used for data storage, which means the array has no redundant or parity data for recovery in the event that one of the drives should fail. This case is often denoted as RAID-0. When a data channel drive fails and a parity channel exists, a crippled operating mode uses the parity drive along with the other good data channel drives to generate the data that is lost and to rebuild data onto a replacement drive. One physical drive per rank can fail and the system will continue to function, but storage capacity is reduced by 100/C %. If the failed drive is a data drive, performance is generally reduced. If the drive is a parity drive, however, performance may appear to improve as now the crippled parity drive does not have to be updated on a write.

For the remainder of this section consider C to be the number of data channels only. With a parity channel, the total number of channels would be C+1.

According to the RAID-4 definition, logical drive $D_{m,p}$ contains logical blocks n, where $$n \in \{M_p C + m, (M_p + 1)C + m, (M_p + 2)C + m, \ldots, (M_p + B_p - 1)C + m\}$$

and where $$M_p = \sum_{k=0}^{p-1} B_k \text{ and } M_0 = 0$$

For example, the following list shows the indices for the logical blocks n contained in the indicated drives:

$$D_{0,0} \rightarrow n \in \{0, 2C, \ldots, (B_0 - 1)C\}$$
$$D_{1,0} \rightarrow n \in \{1, C + 1, 2C + 1, \ldots, (B_0 - 1)C + 1\}$$
$$D_{2,0} \rightarrow n \in \{2, C + 2, 2C + 2, \ldots, (B_0 - 1)C + 2\}$$
$$\vdots$$
$$D_{m,0} \rightarrow n \in \{m, C + m, 2C + m, \ldots, (B_0 - 1)C + m\}$$
$$\vdots$$
$$D_{C-1,0} \rightarrow n \in \{C - 1, 2C - 1, 3C - 1, \ldots, B_0 C - 1\}$$
$$D_{0,1} \rightarrow n \in \{B_0 C, (B_0 + 1)C, \ldots, (B_0 + B_1 - 1)C\}$$
$$D_{1,1} \rightarrow n \in \{B_0 C + 1, (B_0 + 1)C + 1, (B_0 + 2)C + 1 \ldots,$$
$$(B_0 + B_1 - 1)C + 1\}$$
$$D_{2,1} \rightarrow n \in \{B_0 C + 2, (B_0 + 1)C + 2, (B_0 + 2)C + 2 \ldots,$$
$$(B_0 + B_1 - 1)C + 2\}$$
$$D_{m,1} \rightarrow n \in \{B_0 C + m, (B_0 + 1)C + m, (B_0 + 2)C + m \ldots,$$
$$(B_0 + B_1 - 1)C + m\}$$
$$\vdots$$
$$D_{C-1,1} \rightarrow n \in \{(B_0 + 1)C - 1, (B_0 + 2)C - 1, (B_0 + 3)C - 1 \ldots, (B_0 + B_1)C - 1\}$$

etc.

From the definition of RAID-4, it can be seen that the drive channel, m, containing a particular block n is given by $$n = (M_p + l)C + m \text{ where } l \in \{, 1, 2, 3, \ldots, B_p - 1\}$$

so that $$m = n \bmod C \quad (1)$$

and the drive's rank, p, satisfies $$M_p C \leq n < M_{p+1} C \quad (2)$$

Counting the number of blocks less than n on logical drive $D_{m,p}$ and subtracting the total number of blocks in lower ranks of drives yields the address of n on drive $D_{m,p}$, $$s = \frac{n - m}{C} - M_p \quad (3)$$

All of the logical blocks can be transferred to or from the appropriate drives by sequentially reading or writing the N blocks $$\frac{(n+i) - (n+i) \bmod C}{C} - M_p$$

of drive $D_{(n+i) \bmod C, p}$ for i=0 to i=N−1. However, this is generally not an efficient procedure, since there is a large amount of bus arbitration, selection, and message passing overhead in issuing multiple READ or WRITE commands to each drive involved in the transfer.

A more efficient process is to determine first each drive, $D_{m,p}$, involved and to determine the starting address and length of the required blocks from each drive. Only one WRITE or READ command need be issued to each drive to complete the transfer. However, RAID Controller 8 becomes more complex because it must interleave the data transferred from or to each channel. The availability of such a controller leads to an efficient procedure as described below.

If initially all the drives on channel m are viewed as one large logical drive, $D_m$, the first step is to map the N logical blocks to the drive, $D_m$, on each channel. The listings in the first two columns of Table 1 are expressions of equations 1 and 3 for each channel with p=0. The last column contains expressions for transfer length. The transfer length is a count of the number of blocks to transfer on each channel, where $K_1 = N \bmod C$, $K_2 = \lfloor N/C \rfloor$, and $$\sigma(x) = \begin{cases} 1 & \text{for } x > 0 \\ 0 & \text{otherwise} \end{cases}$$

TABLE 1

| RAID-4: Blocks on Each Channel | | |
|---|---|---|
| Channel number (m) | Start Address on $D_m$ | Transfer Length |
| n mod C | $\lfloor n/C \rfloor$ | $K_2 + \sigma(K_1)$ |
| (n + 1) mod C | $\lfloor (n+1)/C \rfloor$ | $K_2 + \sigma(K_1 - 1)$ |
| ... | ... | ... |
| (n + C − 1) mod C | $\lfloor (n + C - 1)/C \rfloor$ | $K_2 + \sigma(K_1 - C + 1)$ |

Note that if N<C the transfer length on some of the channels is 0, which means that these channels are not involved in the transfer. Also, the correct order of channel access to interleave the outgoing data blocks or separate the incoming data blocks is from the top row to the bottom row in Table 1.

The next step is to map each channel's logical blocks to logical drive data blocks, and to determine the first drives on each channel involved in the transfer. For channel $$m_i = (n + i) \bmod C \quad (4)$$

where $0 \leq i \leq C-1$, the first drive, $D_{m_i, p_i}$, has rank $p_i$ that satisfies $$M_{p_i} C \leq n + i < M_{p_i + 1} C \quad (5)$$

Using equation 3, the starting block address is given by $$s_i(0) = \frac{(n+i) - m_i}{C} - M_{p_i} \quad (6)$$

and using Table 1, the number of blocks to transfer is $$x_i(0) = \min(K_2 + \sigma(K_1 - i), B_{p_i} - s_i(0)) \quad (7)$$

where $B_{p_i} - s_i(0)$ are the available blocks on logical drive $D_{mi,pi}$ between the address $s_i(0)$ and the end of the drive. These formulas define the parameters of READ or WRITE commands that should be issued to the first drive of each channel involved in the transfer.

If $x_i(0)<K_2+\sigma(K_1-i)$, additional higher rank drives are involved in the transfer. In this case, the next rank is $p_i+1$, the starting address is $s_i(1)=0$, and the number of blocks to transfer is $$x_i(1)=\max(0,\min(K_2+\sigma(K_1-i)-x_i(0),B_{(pi+1)}))$$

Additional drives of rank, $p_{i+j}$ and starting block addresses of $s_i(j)=0$ are involved in the transfer if $$x_i(j) = \max\left(0, \min\left(K_2 + \sigma(K_1 - i) - \sum_{k=0}^{j-1} , B_{(pi+j)}\right)\right) > 0 \quad (8)$$

After READ or WRITE commands have been issued to the first drive on each channel, SEEK commands should be issued to the second drive (if the first one disconnects from the bus). After the first drive has completed and READ or WRITE commands have been issued to the second drive on each channel, SEEK commands should be issued to the third drive (if the second one disconnects); and so on until all drives involved have completed their transfers.

Often in practice it is more efficient to stripe a set of logical blocks instead of a single logical block as shown above. One reason is that some operating systems require a small logical blocksize in order to boot properly, but then they issue data transfer requests having much larger typical blocksizes. In this case data transfer requests are most efficiently processed if a set of logical blocks is striped, where the total size in bytes of the set is equal to the size in bytes of a typical request. For example, if sets of 2 logical blocks were striped over 3 channels, channel 0 would have logical blocks 0, 1, 6, 7, 12, 13, . . . , channel 1 would have logical blocks 2, 3, 8, 9, 14, 15, . . . , and channel 2 would have logical blocks 4, 5, 10, 11, 16, 17, . . . . Generally, more requests could then be processed in parallel because on average the least number of channels would be used to process the requests.

A simple modification of the above mapping procedure supports the striping of a set of k logical blocks, where k denotes the striping blocksize. If k blocks are striped on each channel, execute the above mapping procedure after replacing n and N with n' and N' respectively, where $$n' = \lfloor n/k \rfloor$$

$$N' = \lfloor (n+N-1)/k \rfloor - \lfloor n/k \rfloor + 1 \quad (9)$$

Then compute a new starting address, $s_0'(0)$ for the first logical drive from which data is transferred, using $$s_0'(0) = s_0(0) + n \bmod k \quad (10)$$

and if $((N+n) \bmod k)>0$, compute a new transfer length, $x_i'(j)$, for the last logical drive from which data is transferred, using $$x_i'(j) = x_i(j) - k + ((N+n) \bmod k) \quad (11)$$

The pseudo-code program of FIG. 5, written in the style of a C-language program, describes a mapping procedure implemented by I/O Process Manager 19 for translating a logical data transfer request to a list of data transfer requests for each drive involved in the transfer. The striping block size is given by NumStripeBlks in units of number of logical blocks.

Block Striping with Parity (RAID-5):

RAID-5 is a block striping technique with a lower probability of having a bottleneck in updating parity data than does RAID-4 with a parity channel. In RAID-4 with parity, a bottleneck to the parity channel is created because each write operation to the array must update the parity channel.

One approach to understanding the RAID-5 mapping is to think of it as having the same logical block to logical drive block mapping as RAID-4 with no parity, except that some of the logical blocks are reserved for parity blocks. In order to allow multiple I/O operations to proceed in parallel, parity blocks are distributed among all the channels. If one channel were to be dedicated for parity, each I/O Write operation would use it, preventing more than one Write from executing in parallel. In crippled mode, the parity blocks are used to recover data that is lost when a data drive fails and to rebuild data onto a replacement drive. One physical drive per rank can fail and the system will continue to function, albeit with less performance. Storage capacity is reduced by 100/C %.

Let the parity blocks have logical block addresses, n, where $$
\begin{aligned}
n \bmod C^2 &= 0 \\
n \bmod C^2 &= C+1 \\
n \bmod C^2 &= 2C+2 \\
n \bmod C^2 &= 3C+3 \\
&\vdots \\
n \bmod C^2 &= C^2-1
\end{aligned}
\quad (12)
$$

In this case the number of parity blocks, P(n), between 0 and n, inclusive, is given by $$P(n) = C \frac{n}{C(C-1)} + \frac{n \bmod C(C-1)}{C} + 1 \quad (13)$$

The first term is the number of parity blocks between 0 (inclusive) and the largest integer multiple of $C^2$ in n (inclusive), and the remaining two terms equal the parity blocks in the remaining addresses greater than the largest integer multiple of $C^2$ in n and less than or equal to n.

For a read or write data transfer of N contiguous logical blocks starting with block n, the RAID-4 mapping procedure with no parity channels can be used if n and N are first modified using equation 13 to account for the parity blocks:

$$n' = n + P(n)$$

$$N' = N + P(n+N-1) - P(n) \quad (14)$$

If $B_p$ is interpreted as the number of logical blocks and parity blocks in each drive at rank p. Then $M_p$ is $$M_p = \sum_{k=0}^{p-1} B_k \text{ and } M_0 = 0$$

and it follows that a RAID-5 mapping can be expressed by the pseudo-code shown in FIG. 6.

For the above procedure to execute correctly, the data transfer requests to Data Path Manager 18 must indicate that a RAID-5, and not a RAID-4, procedure is being executed, or a global system variable indicating RAID-5 must be properly set so that Data Path Manager 18 executes the proper procedure. To execute RAID-5, Data Path Manager 18 determines that block k of drive $D_{m,p}$ is a parity block if and only if $$(C(M_p+k)+m) \bmod C^2 = Cm+m \tag{15}$$

These parity blocks are used to recover data in case one of the physical data block reads fails.

In a RAID-5 Write operation the blocks being overwritten and the corresponding parity blocks must first be read in order to update the parity blocks. In this case parity blocks are identified using equation 15.

Byte Striping (RAID-3):

In this scheme data is byte striped across all channels except for an optional one that is reserved to store parity data. Each logical data block is split equally among corresponding logical drive data blocks on each data channel. When a data channel drive fails and a parity channel exists, a crippled operating mode uses the parity drive and the good data drives to generate the data that is lost and to rebuild data onto a replacement drive. One physical drive per rank can fail and the system will continue to function, but storage capacity is reduced by 100/C %.

Because each transfer involves all data channels symmetrically, this mapping is simpler than, but similar to the scheme for RAID-4. Instead of interpreting $B_p$ as the number of logical data blocks contained in each drive of rank p, as before, interpret $B_p$ as the number of logical blocks contained in ALL drives at rank p. Then $M_p$ is $$M_p = \sum_{k=0}^{p-1} B_k \text{ and } M_0 = 0$$

This is reasonable because RAID 3 always uses all the drive channels, since a single logical block is always divided across all C–1 drive blocks (one drive block per data channel).

For RAID-3, set the parameter for the number of channels, C, to 1, regardless of of the number of actual channels in the logical array. In this case with i=0 and j=0, equations 5 and 6 give the rank, p, of the first row of logical drives involved in the transfer, $$M_p \leq n < M_{p+1} \tag{16}$$

and the starting block address on each drive, $$s(0) = n - M_p \tag{17}$$

Similarly, equation 7 with i=0 gives the number of blocks to transfer, $$x(0) = \min(N, B_p - s(0)) \tag{18}$$

These formulas define the parameters of READ or WRITE commands that should be issued to each drive on each drive channel (data and parity) simultaneously.

If each logical block has byte numbers 0 to V bytes, where V is an integer multiple of C–1, the bytes on data channel $0 \leq i < C-1$ are $$i, C-1+i, 2C-2+i, 3C-3+i, \ldots, V-C+1-i$$

Channel C–1 is the parity channel. With no faulty drives, data transfers sequentially interleave the bytes on channels $0 \leq i < C-1$, and the parity byte is written on channel C–1 during a Write operation. If a data drive fails, only the Read operation changes in that it reconstructs data using the corresponding parity drive. If a parity drive fails, only the Write operation changes because the parity drive no longer has to be updated.

If x(0)<N, additional higher rank drives are involved in the transfer In this case, the next rank is p+1, the starting address is s(1)=0, and the number of blocks to transfer is $$x(1) = \max(0, \min(N-x(0), B_{p+1}))$$

Additional drives of rank, p+j and starting block addresses of s(j)=0 are involved in the transfer if $$x(j) = \max\left(0, \min\left(N - \sum_{k=0}^{j-1} x(k), B_{p+j}\right)\right) > 0 \tag{19}$$

After READ or WRITE commands have been issued to the first drive on each channel, SEEK commands should be issued to the second drive (if the first one disconnects from the bus). After the first drive has completed and READ or WRITE commands have been issued to the second drive on each channel, SEEK commands should be issued to the third drive (if the second one disconnects); and so on until all drives involved have completed their transfers.

The C-language like pseudo-code of FIG. 7 describes a RAID-3 mapping procedure implemented by I/O Process Manager 19.

Block Striping, Mirrored Data (RAID-1):

In this scheme data is duplicated on equal sized logical drive subarrays that exist on Hard Disk Drive Array 12. If there are n subarrays, duplicating data provides tolerance to n–1 drive failures in each corresponding position in the arrays. However there are severe storage capacity penalties. In the typical case of duplicating the data on two subarrays (This is the RAID-1 scheme) storage capacity is reduced by 50%. For simplicity the remainder of this section describes the case of two identical subarrays, but the scheme is not limited to this case.

A convenient way to think of the subarrays is as two independent drive arrays. In this case, a RAID-1 mapping could be expressed in terms of a RAID-4 mapping as shown in FIG. 8. The RAID-4 mapping function's arguments are extended to include a logical drive array designation.

In the case of a Read operation, two reads of identical data are not necessarily performed. Because each Read is associated with the same "data transfer process", additional layers of software issue a RAID-4 Read to the first Logical Drive Array that is free. The Read to the mirrored drive array may not be performed. This leaves one drive array free to process a Read from a different data transfer process.

In the case of a Write operation some performance is lost because two writes are performed. However, the system remains functional as long as at least one of each of the mirrored logical drives is functional.

However, in some circumstances it might benefit for two independent RAID-4 reads to be issued to both drives in parallel in order to start a race. Data is then taken from the logical drive that returns with the information first. If the other drive is not faulty and returns identical data, it is not used.

If there are failures in the underlying physical drives composing the logical drive arrays, a "crippled" mode of functioning interleaves data from both logical drives to complete the transfer. Data from one logical drive is also used to rebuild the proper data onto a replacement drive for the faulty drive.

Besides the possibility of Hard Disk Drive Array 12 being partitioned into multiple subarrays each configured with different RAID formats, certain kinds of RAID format nesting is also possible, such as a read operation for a RAID-1 (mirrored) array with a RAID-5 format and RAID-3 format respectively on each of the mirrored halves, as illustrated by the psuedo-code in FIG. 9(a). Because the RAID-3 half is most suited for reading a large number of contiguous blocks, while the RAID-5 half is most suited for a random read of a small number of blocks, performance is enhanced when each half is preferentially given transfers for which it is most suited. An example of another type of RAID-1 (mirrored) array is having a RAID-3 format on each of the mirrored halves, as illustrated by the pseudo-code in FIG. 9(b).

Two Dimensional Block Striping(RAID-2D5 and RAID-2D4):

Two dimensional block striping is a high bandwidth block striping technique that stripes data blocks across all drives of a logical drive array. Both the RAID-4 and RAID-5 block striping techniques described above could be extended to two dimensions. The parallel access advantage for RAID-5 striping applies for small data length accesses. For large data length accesses, all channels are typically busy when using two dimensional striping. In this case extending RAID-4 type striping would be marginally more efficient than extending RAID-5 type striping, but ineffecient for processing many small data length write accesses in parallel. RAID-5 striping is efficient for both large and small data length accesses. For optimum performance, no two logical drives should be mapped to the same physical drive. Using either RAID-5 or RAID-4 parity data, one physical drive per rank can fail and the system will continue to function, albeit with less performance. In crippled mode, the parity blocks are used to recover data that is lost when a data drive fails and to rebuild data onto a replacement drive. Storage capacity is reduced by 100/C %, where C represents the total number of array channels.

For a read or write data transfer of N contiguous logical blocks starting with block n, the RAID-5 (RAID-4) mapping procedure can be used to implement the RAID-2D5 (RAID-2D4) mapping if the number of logical data channels, C, and number of logical ranks, R in the logical array are first modified to $$C' = C \cdot R$$
$$R' = 1 \quad (20)$$

This makes the 2-D array appear as one very wide 1-D array with one rank. In the case of RAID-2D4 there are R parity channels at the end, where each parity channel applies to one equal sized subset of C channels. After the RAID-5 (RAID-4) mapping, the mapped rank, $m_i$, and mapped channel, $p_i=1$, for each drive, $D_i$, involved in the transfer must be modified according to $$m_i' = m_i \bmod C$$
$$p_i' = \lfloor m_i/C \rfloor \quad (21)$$

This mapping can be expressed by the pseudo-code shown in FIG. 10. Alternatively, an independent mapping scheme very similar to the RAID-4 mapping described above could be constructed specifically for the RAID-2D4 mapping. Note that for RAID-5 (RAID-4) mapping onto an array with one rank, the computational steps for higher ranks will not be executed.

With appropriate control, RAID-2D5 (RAID-2D4) striping approaches full bandwidth utilization on each drive channel. If the maximum data transfer rate of a single channel is given as $f_c$ bytes/second, and the striping block size is represented by b bytes, an upper bound on the average total transfer rate, $T_a$ in bytes/second is $$T_a = \frac{RCb}{Rb/f_c + 2Rd} = \frac{Cb}{b/f_c + 2d} \quad (22)$$

The parameter d represents the time in seconds for communication overheads in arbitrating for the bus, selecting a particular drive, and sending a data transfer command to the drive.

It is assumed that $f_c$ is greater than the maximum sustained data rate that is possible when the data is directly transferred from/to a hard drive's platter. For data transfer performance approaching $T_a$, a drive must generally disconnect from the bus if, after receiving a data transfer command, it can not send the data at the maximum channel transfer rate, $f_c$. For a SCSI drive this means that the data is not already in its internal cache. The 2 in equation 22 comes from the fact that there is also an arbitration, selection, and message passing communication overhead when the drive reconnects to the bus to transfer data. The bound expressed by $T_a$ assumes that seek related latencies are happening in parallel with other drives receiving commands. If the typical seek time is longer than the time required to issue commands to each drive on a channel, i.e. R·d, the bound $T_a$ can not be obtained.

This striping technique generally requires more complex control than RAID-4 or RAID-5. For example, in SCSI-I or SCSI-II drives, significant amounts of data are buffered in Data Path Memory Buffer 250 by the RAID controller because the SCSI protocol does not provide a means for the controller to select the order in which the drives reconnect to the bus to transfer data. With a large enough Data Path Memory Buffer 250, commands could also be queued on the drives in the array.

When a typical access calls for a fixed size large contiguous block of data, the simple transfer rate model described by equation 22 suggests that a strategy for selecting the striping block size is to divide the typical access size by the total number of data drives in the array, R·C. This keeps all drives active and requires minimal data stream interleaving from each drive.

However, a model which includes drive caching policies and parameters may suggest a better strategy. The drive cache size should at least be large enough to hold two striping blocks, and if commands are queued, the cache should be larger than a single striping block times the number of commands queued.

When a typical access calls for a fixed size small block of data, a striping block size equal to this typical data size on average allows the most number of requests to execute in parallel. The reasons are the same as described above for RAID-5 and RAID-4 block striping.

Scheduling Queued I/O Requests:

The above described procedures show how to efficiently translate a single I/O request for the disk array controller system to one or more I/O requests for the logical drives in Hard Drive Array 12. This section describes how to schedule the order of execution of queued I/O requests to improve throughput.

Under the common SCSI interface standard, a disk drive is given the flexibility to select the execution order of those I/O requests that are marked with a "SIMPLE" queue tag. However, a drive can not select the order of execution of I/O requests that are marked with "ORDERED" or "HEAD OF QUEUE" tags. These request categories must be scheduled according to SCSI-2 protocol. The development in this section applies to the most common case of SIMPLE queue tags for SCSI systems.

Objectives for the scheduling procedure include:

1. Minimizing the average access time for each physical drive.
2. Maximizing data transfer activity across all channels.
3. Ensuring a bounded latency for any queued I/O request.

Figure 11:
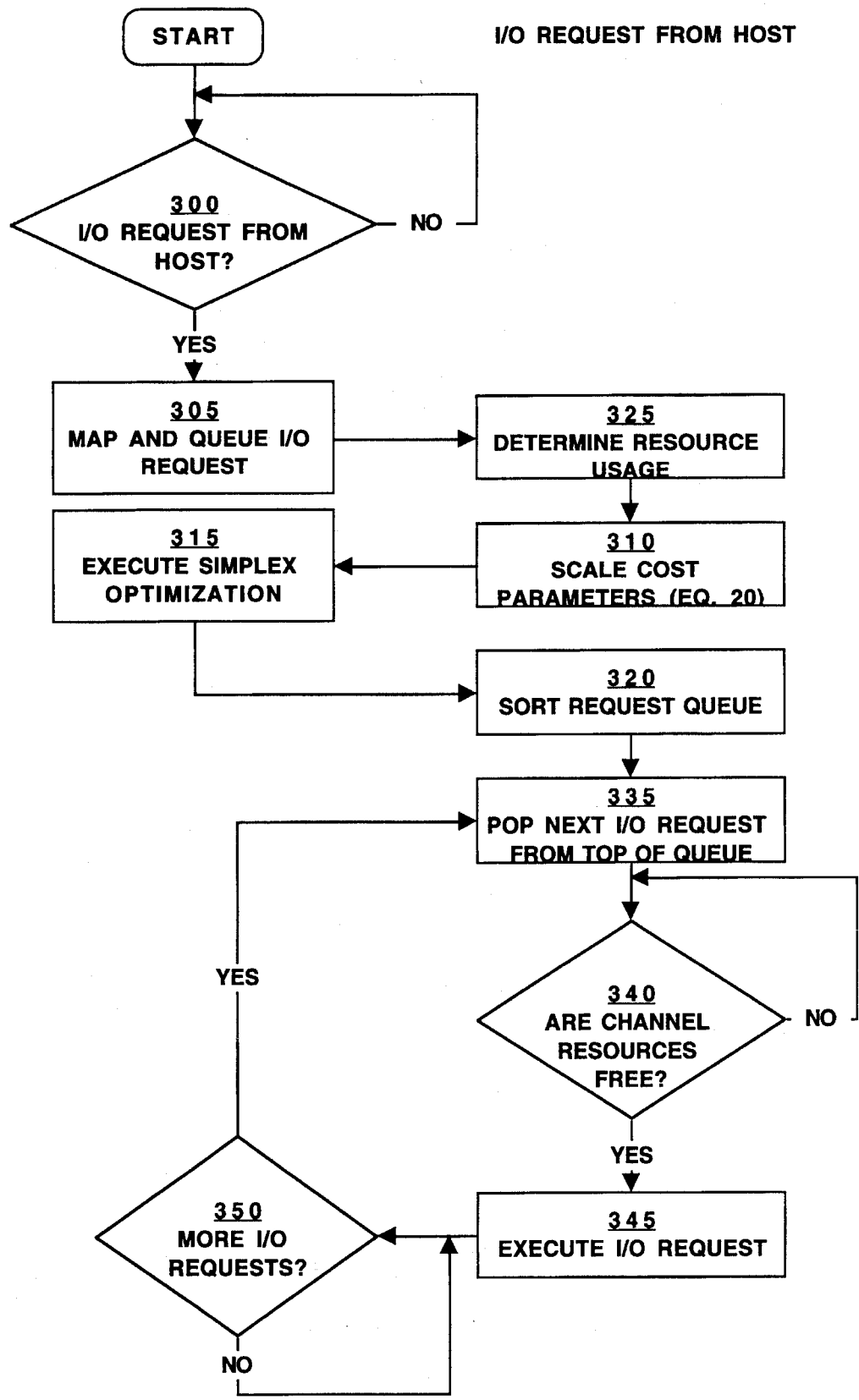
FIG. 11 is a flow chart showing host I/O request scheduling.

The flow chart in FIG. 11 diagrams the scheduling procedure. Module 300 and 305 are part of Host Interface Manager 16. Modules 310, 315, 320, 325, 335, 345 and 350 are part of I/O Process Manager 19, while module 340 is part of Data Path Manager 18.

First host I/O requests are received by module 300. An I/O request consists of a read or write of N logical blocks starting with a particular logical block, n, and ending with the logical block n+n−1. Suppose that m I/O requests have been received and queued by module 305, $$n_1 \text{ to } n_1 + N_1 - 1$$
$$n_2 \text{ to } n_2 + N_2 - 1$$
$$n_3 \text{ to } n_3 + N_3 - 1$$
$$\vdots$$
$$n_m \text{ to } n_m + N_m - 1 \quad (23)$$

The request with start address $n_j$ will be referred to as the $j^{th}$ request. The problem is to schedule the execution of these requests so that the above objectives are met.

Figure 12:
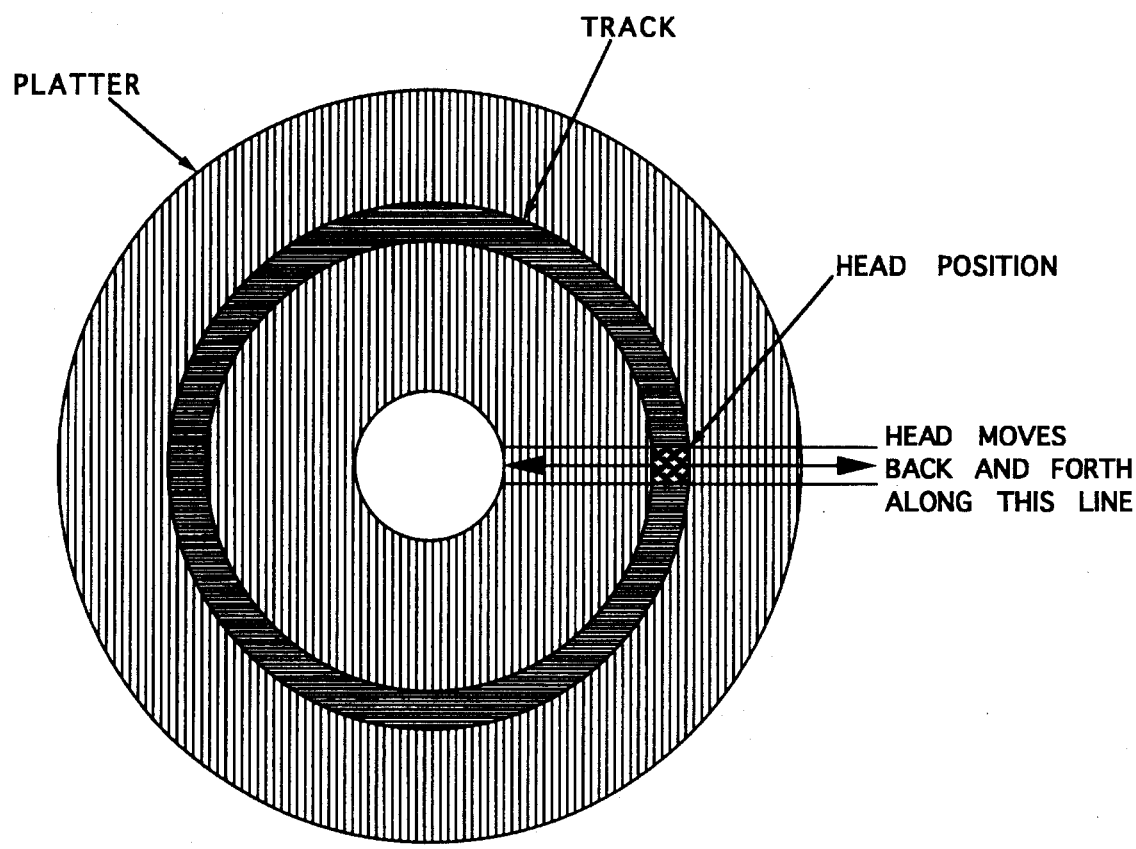

The RAID procedures described previously minimized the number of physical drive accesses, which minimized added latency due to bus cycle overheads. In scheduling multiple I/O requests, an important factor to minimize is the mechanical seek time of the physical drives—the time required for a drive to position its heads over the appropriate tracks containing the required blocks of data. FIG. 12 diagrams a single head and its movement on a single platter. Most disk drives have multiple heads moving in parallel across the front and back of several platters. The coinciding tracks form a cylinder containing the desired data blocks.

The seek time is the single largest factor in access latency that can be controlled without having access to internal drive storage geometry and control details. The seek time between I/O requests is approximated to be proportional to the difference or gap between the last data block address that is accessed in the last I/O request and the first data block address that is accessed in the next I/O request. This is reasonable because a drive's heads will generally require more time to position themselves the larger the gap is between these addresses. However, actual seek time in any particular case depends on platter geometry and the distribution of blocks on the platter, and average seek time may not even be linearly proportional to this address gap if outer tracks contain more data blocks than inner tracks, for example. Nevertheless, the fact that larger address differences generally imply longer seek times makes our approximation useful. When the addresses are logical addresses, the same argument suggests that total seek time on the physical drives can be approximated as proportional to the logical address gaps. The reason is that the logical addresses map to one or more physical addresses whose relative separations in the physical drives are larger in proportion to logical address separations.

If the last address accessed (or the initial address) is represented by $$n_0 + N_0$$

the total sum, D, of the address gaps in a queued set of I/O processes is equal to $$D = \sum_{i=0}^{m-1} \sum_{j=1}^{m} |n_i + N_i - n_j| x_{ij} \quad (24)$$

subject to $$\sum_{i=0}^{m-1} x_{ij} = 1, \text{ for } j = 1, 2, \ldots, m$$

$$\sum_{j=1}^{m} x_{ij} = 1, \text{ for } i = 0, 1, 2, \ldots, m-1$$

$$x_{ij} \in \{0, 1\},$$

$$x_{ii} = x_{jj} = 0$$

When the binary valued coefficient $x_{ij}=1$, the I/O request with start address $n_j$ follows the I/O request with start request $n_i$ in the queue. An optimal schedule is associated with a solution $x_{ij}$ to $$\text{minimize } D = \sum_{i=0}^{m-1} \sum_{j=1}^{m} |n_i + N_i - n_j| x_{ij} \quad (25)$$

subject to $$\sum_{i=0}^{m-1} x_{ij} = 1, \text{ for } j = 1, 2, \ldots, m$$

$$\sum_{j=1}^{m} x_{ij} = 1, \text{ for } i = 0, 1, 2, \ldots, m-1$$

$$x_{ij} \in \{0, 1\}, x_{ii} = 0$$

where D is known as a cost function. The book "Linear Network Optimization: Algorithms and Codes", by Dimitri Bertsekas, The MIT Press, 1991, presents several types of linear programs, such as the well known Simplex Optimization 315, that can be used to find the optimal solution to this problem.

After a solution to equation 25 is computed, the solution is used by module 320 to sort the request queue for an optimal schedule. When $x_{ij}=1$, I/O request j follows I/O request i in an optimal schedule. Think of the $x_{ij}$ as elements of an m+1 by m matrix. Each row and each column of this matrix has exactly one nonzero element equal to 1. Starting with row 0, search for the row element with value 1. The matrix column index of this element, say $b_1$, gives the number of the first I/O request to execute in an optimum schedule. Then search row $b_1$ for the row element with value 1. The matrix column index of this element gives the number of the next I/O request to execute in an optimum schedule. Repeat until all matrix rows have been searched. In other words, order the m coefficients $x_{ij}$ beginning with $x_{0b_1}$, as follows $$x_{0b_1}, x_{b_1b_2}, x_{b_2b_3}, \ldots, x_{b_{m-1}b_m}$$

The $j^{th}$ index of a coefficient becomes an $i^{th}$ index of the next right adjacent coefficient. Then the m coefficients, $b_1, b_2, b_3, \ldots, b_m$ indicate the first to last sequence for an optimal ordering of the requests indexed 1, 2, 3, . . . , m.

The resulting optimal schedule, however, does not guarantee that there will not be unbounded latencies for a particular I/O request. One method for guaranteeing bounded latencies is to periodically reduce the "cost parameters" (i.e. the coefficients of $x_{ij}$ in equation 25) associated with particular I/O requests when they have been preempted by new requests. This will bias the scheduling to select requests that have been waiting for longer periods of time.

For example, the cost parameters associated with the I/O request k having starting address $n_k$ are $$|n_i+N_i-n_k| \text{ where } i=, 1, 2, \ldots, m-1$$

One example of a method to reduce $n_k$'s cost parameters is to scale them by a power of 2 (in this case division is particularly simple), $$\frac{|n_i + N_i - n_k|}{2^{ad_k}} \tag{26}$$

where $d_k$ counts the number of times a new I/O request has caused a new scheduling without request k being executed. The constant parameter $\alpha$ controls the rate at which the cost parameters associated with $n_k$ are reduced. If $\alpha$ is a fractional quantity, such as ½, the scaling is only done when $\alpha \cdot d_k$ is an integer. This scaling is done by module 310 of FIG. 11. With this modification, the optimization problem has same general solvable form with new cost parameters:

$$\text{minimize } D = \sum_{i=0}^{m-1} \sum_{j=1}^{m} \frac{|n_i + N_i - n_j|}{2^{ad_j}} x_{ij} \tag{27}$$

subject to $$\sum_{i=0}^{m-1} x_{ij} = 1, \text{ for } j = 1, 2, \ldots, m$$

$$\sum_{j=1}^{m} x_{ij} = 1, \text{ for } i = 0, 1, 2, \ldots, m-1$$

$$x_{ij} \in \{0, 1\}, x_{ii} = = 0$$

Simplex Optimization 315 is used to find the optimal solution. I/O latencies are guaranteed to be bounded because the cost parameters are approaching 0, causing the associated I/O requests to be placed at the head of the queue.

Because the execution procedure specified by modules 335, 340, 345, and 350 will process in parallel those sequentially ordered I/O requests whose drive channel usage does not conflict, the preferred method of optimized scheduling accounts for this parallelism. Although the above process sorts I/O requests to minimize seek time overheads, there is no guarantee that all drive channels are being used effectively. In module 325 this problem is solved by computing the channel usage of all I/O requests. In the procedure detailed below the cost function is modified so that there is 0 cost when one request can follow another in parallel. I/O requests are then optimally scheduled by modules 315 and 320 to account for all possible combinations of parallel execution of the requests.

After mapping the logical data request address range to physical address ranges on particular drives and by accessing the state of the system (crippled or normal functioning), the exact drive channel usage required by a particular I/O process is easily determined. This usage can be represented by a C×1 "resource" vector, a, of 1's and 0's, where C is the number of channels in the drive array. A 1 in the $j_{th}$ row of this column vector indicates that the $j_{th}$ channel is being used by the process, while a 0 indicates that the channel is not being used. Two I/O processes can execute in parallel, if the inner product of their respective resource vectors, $$a_1^T \cdot a_2$$

results in the null vector. In this case the vectors are orthogonal. Also the inner product is efficiently computed by logical AND-ing of the corresponding components of the resource vectors. Entries in the resource vector could also represent any other shared resources, other than channels, used by the I/O processes.

Changing the cost parameters to include the inner product of the resource vectors results in a new improved formulation of the optimization with the same general solvable form.

$$\text{minimize } D = \sum_{i=0}^{m-1} \sum_{j=1}^{m} \alpha_i^T \cdot \alpha_j \frac{|n_i + N_i - n_j|}{2^{ad_j}} x_{ij} \tag{28}$$

subject to $$\sum_{i=0}^{m-1} x_{ij} = 1, \text{ for } j = 1, 2, \ldots, m$$

$$\sum_{j=1}^{m} x_{ij} = 1, \text{ for } i = 0, 1, 2, \ldots, m-1$$

$$x_{ij} \in \{0, 1\}, x_{ii} = x_{jj} = 0$$

$a_i^T \cdot a_j = 0$ indicates that request j can follow request i with no cost because they are able to execute in parallel. Simplex Optimization 315 is used to find the optimal schedule, and module 320 sorts the request queue according to the optimal schedule using the same sorting procedure detailed above. This optimized schedule simultaneously minimizes address gaps between requests, bounds latencies, and orders I/O processes so that modules 335, 340, 345, and 350 will on average be executing I/O processes in parallel more often.

Instead of using the latter cost function, an alternative, less optimal implementation to determine the potential for parallel execution is to create a resource matrix, A, from the resource vectors of each queued I/O request, $$A = [a_0 \ a_1 \ a_2 \ldots a_{m-1}] \tag{29}$$

The 0's in the the symmetric product $A^T A$ correspond to pairs of resource vectors that are orthogonal and hence indicate all combinations of two I/O processes that can execute in parallel. A 0 in row i and column j indicates that I/O request i can access the array in parallel with request j. However, because $A^T A$ is symmetric, values in the upper or lower diagonal of part $A^T A$ provide the same information, and hence either one of these parts of $A^T A$ can be ignored. When two I/O processes with resource vectors $a_i$ and $a_j$ are scheduled in parallel, a new single resource vector, $q_j=a_i+a_j$, replaces both $a_i$ and $a_j$ to create a new resource matrix, $A_q$, with one less column. The 0's in the product $A_q^T A_q$ indicate all combinations of three I/O processes that can execute in parallel. After combinations of three I/O processes are scheduled, the corresponding orthogonal resource vectors are added and replace the original vectors. The process is repeated until the resource matrix has no upper diagonal 0's.

The top of the sorted host request queue is popped by module 335 and sent to module 340 that checks to see if the required Hard Disk Drive Array 12 channels are free, and, if so, module 345 executes the I/O request. Module 350 then determines if there are more I/O requests, and if so, module 335 executes the next I/O request.

Although this invention disclosure has referred to arrays of hard disk memory, it would be apparent to those practicing the art that the methods and control apparatus described are applicable to other forms of memory performing the same function. Hard Disk Drive Array 12, for example, could be an array of floppy drives, tape drives, or silicon drives (i.e. composed of some form of semiconductor memory). Because optimization of equation 25 for scheduling may not be as useful in the case of silicon drive types as it is in the case of the mechanical drive types, this part of the control system may harmlessly be eliminated, while the other parts remain applicable.

What is claimed is:

1. A fault tolerant memory array control system for controlling data accesses to and from a host bus and a memory array of discrete bulk memory units, organized by physical channel index and physical rank index, wherein bulk memory units with the same rank index are of a similar type, and bulk memory units with the same channel index share a common channel data bus, the memory array control system comprising:

(a) a controller system bus for control and data communication between elements of the memory array control system;

(b) a microprocessor controller coupled to the controller system bus for performing logical control of the memory array control system elements, the microprocessor controller comprising:

(i) a microprocessor for executing operating control programs and configuration control programs comprising:

(aa) a translation program for optimally translating address data of a host logical data access request to the memory array into a minimal set of memory array physical address and length data for accessing appropriate bulk memory units;

(bb) a scheduling program for determining and executing an optimal sequence of steps by which to execute a queued set of memory array access requests, including parallel access when possible, by optimizing a prescribed performance function criterion;

(cc) a crippled operation program for using module redundancy and parity data encoding methods for sustaining system operation after a bulk memory failure; and (dd) a computer kernel control means for coordinating all system functions and resources; and (ii) an interrupt controller connected to the microprocessor for accepting and prioritizing externally generated interrupt requests from the host system bus interface and from a drive channel controller;

c) a host system bus interface coupled to the controller bus;

(d) a set of more than one drive channel controller, each controller of the set for coupling to a unique common channel data bus for selecting a bulk memory unit, and for control of and data transfers to and from the selected bulk memory unit sharing the common channel data bus;

a data path unit comprising;

(i) a data path selector, having an output and more than one input, each input connected to one of the set of drive channel controllers for selecting a drive channel; and (ii) a data path coupled to the host system bus interface and connected to the data path selector output for coupling the selected drive channel to the host computer system bus; and (f) translation means, controlled by the translation program, for translating logical access address data to a physical array access address data set for an array of physical channels, using a RAID format, the logical access address data described by a starting block address, and a block length parameter indicating the number of contiguous blocks to be accessed, and producing a set of channel indices, a set of channel starting addresses, and a set of channel transfer length parameters, indicating the number of contiguous blocks to be accessed for each physical rank, for each channel, for producing a set of physical access address data requiring a minimal set of access commands.

2. The system of claim 1 wherein the translation means is for accommodating an array of C logical data channels, using a RAID-4 format, the logical access address data described by a starting block address, n, and a logical block length parameter, N, indicating the number of contiguous blocks to be accessed, and producing a set of channel indices, $\{m_i\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the translation means comprises means for:

(a) mapping the logical block address information given as the logical starting block, n, and the number of contiguous blocks, N, to be accessed into a set of logical channel indices, $\{m_i\}$, by use of the following relationship:

$$m_i = (n+i) \bmod C,$$

where $0 \leq i \leq C-1$ is an index representing the order of accessing the channel corresponding to the value of $m_i$;

(b) identifying the first logical drive, $D_{mi,pi}$, on each channel involved in the access, the coordinate parameters $(m_i, p_i)$, satisfying the following conditions:

$$M_{pi} \leq (n+i)/C \leq M_{pi+1},$$

where $M_{pi} = \Sigma_{j=0}^{pi-1} B_j$, $p_i$ is logical rank index, and $B_j$ is the number of blocks in a rank j logical drive;

(c) computing a set of starting logical drive block addresses for the first logical drive, $D_{mi,pi}$, on each channel, $\{s_{mi}(0)\}$, as follows:

$$s_{mi}(0) = (((n+i)-m_i)/C) - M_{pi};$$

(d) computing the number of blocks to be accessed, $x_i(0)$, for each logical drive, $D_{mi,pi}$, as follows:

$$x_i(0) = \min\{\lfloor N/C \rfloor + \sigma((N \bmod C)-i), B_{pi}-s_{mi}(0)\},$$

where $\sigma(\cdot)=1$ for $((N \bmod C)-i)>0$, and $\sigma(\cdot)=0$ otherwise;

(e) testing to determine if additional higher logical ranks are involved in the access by evaluating if:

$$x_i(0) < \lfloor N/C \rfloor + \sigma((N \bmod C)-i);$$

(f) setting the starting logical drive block address in logical drive $D_{mi,pi+1}$, $s_{mi}(1)$: 0, if $x_i(0)$ satisfies the condition of testing means (e);

(g) computing the number of data blocks in logical drive $D_{mi,pi+1}$, $x_i(1)$, if $x_i(0)$ satisfies the condition of testing means (e), using the following expression:

$$x_i(1) = \max\{0, \min\{\lfloor N/C \rfloor + \sigma((N \bmod C)-i) - x_i(0), B_{(pi+1)}\}\};$$

(h) testing to determine if additional higher logical ranks are involved in the access by evaluating if $x_i(j)>0$, where $$x_i(j) = \max \left\{ 0, \min \left\{ \lfloor N/C \rfloor + \sigma((N \bmod C) - i) - \sum_{k=0}^{j-1} x_i(k), B_{(p_i+j)} \right\} \right\},$$

so that if $x_i(j)>0$, $x_i(j)$ represents the number of blocks in logical drive $D_{mi,pi+j}$ involved in the access and $s_{mi}(j)=0$ represents the starting logical drive block address;

(i) executing a user specified mapping of logical channel and logical rank to physical channel and physical rank of logical drive, $D_{mk,pk}$, to determine physical rank and physical channel; and (j) adding a physical address of the logical drive's block number 0 to the logical starting block address, $s_{mi}(j)$ to determine a physical starting block address.

3. The system of claim 2 wherein the translation means further comprises means for issuing a SEEK command to a next higher physical rank, $p_j+1$, drive after a READ or WRITE command has been issued to a physical drive of rank $p_j$.

4. The system of claim 2 wherein the translation means further comprises additional means for striping a set of k-tuple logical blocks per logical channel, each k-tuple logical block being a subset of k logical blocks, by substituting parameters n' and N' for n and N respectively, where $n'=\lfloor n/k \rfloor$ and $N'=\lfloor (n+N-1)/k \rfloor - \lfloor n/k \rfloor +1$, the additional means comprising means for:

(a) computing a new first logical starting address, $s_{m0}'(0)$, of the first logical drive, $D_{m0,p0}$, involved in the transfer, using $$s_{m0}'(0)=s_{m0}(0)+n \bmod k;$$

(b) computing a new transfer length, $x_i'(j)$, for the last logical drive, $D_{mi,p0+j}$, using $$x_i'(j)=x_i(j)-k+((N+n) \bmod k,$$

if $((N+n) \bmod k)>0$.

5. The system of claim 2 further comprising a parity channel of physical drives.

6. The system of claim 1 wherein the translation means is for accommodating an array of C logical data channels, using a RAID-1 partitioned mirrored data format, the logical access address data described by a starting block address, n, and a logical block length parameter, N, indicating the number of contiguous blocks to be accessed, and producing a set of channel indices, $\{m_i\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical drive access address data requiring a minimal set of access commands, the partitioned memory having a first set of channel and rank coordinates, (m,p), for a first partitioned section of memory, and a second set (m', p') for a second partitioned section of memory, the translation means comprises means for:

(a) mapping the logical block address information given as the logical starting block, n, and the number of contiguous blocks, N, to be accessed into a set of logical channel indices, $\{m_i\}$, by use of the following relationship:

$$m_i=(n+i) \bmod C,$$

where $0 \leq i \leq C-1$ is an index representing the order of accessing the channel corresponding to the value of $m_i$;

(b) identifying the first logical drive, $D_{mi,pi}$, on each channel involved in the access, the coordinate parameters $(m_i,p_i)$, satisfying the following conditions:

$$M_{pi} \leq (n+i)/C \leq M_{pi+1},$$

where $M_{pi}=\Sigma_{j=0}^{pi-1} B_j$, $p_i$ is a logical rank index, and $B_j$ is the number of blocks in a rank j logical drive;

(c) computing a set of starting logical drive block addresses for the first logical drive, $D_{mi,pi}$, on each channel, $\{s_{mi}(0)\}$, as follows:

$$s_{mi}(0)=(((n+i)-m_i)/C)-M_{pi};$$

(d) computing the number of blocks to be accessed, $x_i(0)$, for each logical drive, $D_{mi,pi}$, as follows:

$$x_i(0)=\min\{\lfloor N/C \rfloor + \sigma((N \bmod C)-i), B_{pi}-s_{mi}(0)\},$$

where $\sigma(\cdot)=1$ for $((N \bmod C)-i)>0$, and $\sigma(\cdot)=0$ otherwise;

(e) testing to determine if additional higher logical ranks are involved in the access by evaluating if:

$$x_i(0) < \lfloor N/C \rfloor + \sigma((N \bmod C)-i);$$

(f) setting the starting logical drive block address in logical drive $D_{mi,pi+1}$, $s_{mi}(1)=0$, if $x_i(0)$ satisfies the condition of testing means (e);

(g) computing the number of data blocks in logical drive $D_{mi,pi+1}$, $x_i(1)$, if $x_i(0)$ satisfies the condition of testing means (e), using the following expression:

$$x_i(1)=\max\{0,\min\{\lfloor N/C \rfloor + \sigma((N \bmod C)-i)-x_i(0),B_{(pi+1)}\}\};$$

(h) testing to determine if additional higher logical ranks are involved in the access by evaluating if $x_i(j)>0$, where $$x_i(j) = \max \left\{ 0, \min \left\{ \lfloor N/C \rfloor + \sigma((N \bmod C) - i) - \sum_{k=0}^{j-1} x_i(k), B_{(p_i+j)} \right\} \right\},$$

so that if $x_i(j)>0$, $x_i(j)$ represents the number of blocks in logical drive $D_{mi,pi+j}$ involved in the access and $s_{mi}(j)=0$ represents the starting logical drive block address;

(i) executing a user specified mapping of logical channel and logical rank to physical channel and physical rank of logical drive, $D_{mk,pk}$, to determine physical rank and physical channel; and (j) adding a physical address of the logical drive's block number 0 to the logical starting block address, $s_{mi}(j)$ to determine a physical starting block address;

and for the second memory section, use means (a)–(j) as indicated above, using coordinate system (m', p').

7. The system of claim 6 wherein the partitioning of logical array memory is along a rank boundary.

8. The system of claim 6 wherein the partitioning of logical array memory is along a channel boundary.

9. The system of claim 1 wherein the translation means is for accommodating an array of C logical data channels, using a RAID-3 format, the logical access address data described by a starting block address, n, and a logical block length parameter, N, indicating the number of contiguous blocks to be accessed, and for producing a set of logical drive starting addresses, $\{s(j)\}$, and a set of logical drive transfer length parameters, $\{x(j)\}$, indicating the number of contiguous blocks to be accessed at logical ranks, $\{p_j\}$, for each channel, for producing a set of logical drive access address data requiring a minimal set of access commands, the translation means comprises means for:

(a) mapping the logical block address information given as the logical starting block, n, and the number of contiguous blocks to be accessed, N, into a rank index $p_0$, that represents the first rank of logical drives involved in the data access and satisfies the condition:

$$M_{p0} \leq n \leq M_{p0+1},$$

where $M_{p0} = \sum_{k=0}^{p0-1} B_k'$, $M_0=0$ and $B_k'$ is the number of blocks in all logical drives in rank k;

(b) computing a starting logical drive block address, s(0), on each channel, as follows:

$$s(0) = n - M_{p0};$$

(c) computing the number of blocks to be accessed, x(0), for each channel as follows:

$$x(0) = \min\{N, B_p - s(0)\};$$

(d) testing to determine if additional higher logical ranks are involved in the access by evaluating if:

$$x(0) < N,$$

which, if satisfied, indicates that the rank $p_0+1$ logical drives are involved with starting addresses of s(1)=0;

(e) computing the number of data blocks to be accessed in each logical drive, if x(0) satisfies the condition of testing means (d), by evaluating the following expression:

$$x(1) = \max\{0, \min\{(N-x(0)), B_{(p0+1)}\}\};$$

(f) testing to determine if additional higher logical ranks are involved in the access by evaluating if x(j)>0, where $$x(j) = \max\left\{0, \min\left\{\left(N - \sum_{k=0}^{j-1} x(k)\right), B_{(p0+j)}\right\}\right\},$$

so that if x(j)>0, x(j) represents the number of blocks, beginning at address s(j)=0, in all memory units of rank $p_j = p_0+j$;

(g) executing a user specified mapping of logical channel and logical rank to physical channel and physical rank of logical drive, $D_{mk,pk}$, to determine physical rank and physical channel; and (h) adding the physical address of the logical drive's block number 0 to the logical starting block address, s(k) to determine physical starting block address.

10. The system of claim 1 wherein the translation means is for accommodating an array of C logical data channels, using a RAID-5 block striping format with distributed parity for allowing parallel access operations, the distributed parity blocks located at reserved logical block addresses, $n_j$, where $n_j$ satisfies a constraint condition, $n_j \bmod C^2 = j(C+1)$ for j=0, 1, 2, ..., C−1, the logical access address data described by a starting block address, n, and a logical block length parameter, N, indicating the number of contiguous blocks to be accessed, and producing a set of channel indices, $\{m_i\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the translation means comprises means for:

(a) defining a modified logical block address index, n', and a modified length index, N', satisfying the following conditions:

$$n' = n + P(n)$$

and $$N' = N + P(n+N-1) - P(n),$$

where $$P(n) = C \lfloor \frac{n}{C(C-1)} \rfloor + \lfloor \frac{n \bmod C(C-1)}{C} \rfloor + 1$$

(b) mapping the modified logical block address information given as the logical starting block, n', and the number of contiguous blocks to be accessed, N', into a set of logical channel indices, $\{m_i\}$, by use of the following relationship:

$$m_i = (n'+i) \bmod C,$$

where $0 \leq i \leq C-1$ is an index representing the order of accessing the channel corresponding to the value of $m_i$;

(c) identifying the first logical drive, $D_{mi,pi}$, on each channel involved in the access, the coordinate parameters $(m_i, p_i)$, satisfying the following conditions:

$$M_{pi} \leq (n'+i)/C \leq M_{pi+1},$$

where $M_{pi} = \sum_{j=0}^{pi-1} B_j$, $p_i$ is a logical rank index, and $B_j$ is the number of blocks in rank j logical drive;

(d) computing a set of starting logical drive block addresses for the first logical drive, $D_{mi,pi}$, on each channel, $\{s_{mi}(0)\}$, as follows:

$$s_{mi}(0) = (((n'+i) - m_i)/C) - M_{pi};$$

(e) computing the number of blocks to be accessed, $x_i(0)$, for each logical drive, $D_{mi,pi}$, as follows:

$$x_i(0) = \min\{\lfloor N'/C \rfloor + \sigma((N' \bmod C) - i), B_{pi} - s_{mi}(0)\},$$

where $\sigma(\cdot) = 1$ for ((N' mod C)−i)>0, and $\sigma(\cdot) = 0$ otherwise;

(f) testing to determine if additional higher logical ranks are involved in the access by evaluating if:

$$x_i(0) < \lfloor N'/C \rfloor + \sigma((N' \bmod C) - i);$$

(g) setting the starting logical drive block address in logical drive $$D_{mi,pi+1}, s_{mi}(1)=0;$$

(h) computing the number of data blocks in logical drive $D_{mi,pi+1}$, $x_i(1)$, if $x_i(0)$ satisfies the condition of testing means (f), using the following expression:

$$x_i(1) = \max\{0, \min\{\lfloor N'/C \rfloor + \sigma((N' \bmod C) - i) - x_i(0), B_{pi+1}\}\};$$

(i) testing to determine if additional higher logical ranks are involved in the access by evaluating if $x_i(j) > 0$, where $$x_i(j) = \max\left\{0, \min\left\{\lfloor N'/C \rfloor + \sigma((N' \bmod C) - i) - \sum_{k=0}^{j-1} x_i(k), B_{(p_i+j)}\right\}\right\},$$

so that if $x_i(j) > 0$, $x_i(j)$ represents the number of blocks in logical drive $D_{mi,pi+j}$ involved in the access and $s_{mi}(j)=0$ represents the starting logical drive block address;

(j) executing a user specified mapping of logical channel and logical rank to physical channel and physical rank of logical drive, $D_{mk,pk}$, to determine physical rank and physical channel; and (k) adding the physical address of the logical drive's block number 0 to the logical starting block address, $s_i(j)$, to determine physical starting block address.

11. The system of claim 10 wherein the translation means for translating logical access address data to a physical array access address data set further comprises means for determining that block $k_i$ of drive $D_{mi,pi}$ is a parity block, if, and only if, the following expression is true:

$$(C(M_{pi}+k)+m_i) \bmod C^2 = m_i(C+1).$$

12. The system of claim 1 wherein the translation means is for accommodating an array of C logical data channels, using a two dimensional RAID-2D5 block striping format with distributed parity for allowing parallel access operations, the distributed parity blocks located at reserved logical block addresses, $n_j$, where $n_j$ satisfies a constraint condition, $n_j \bmod C^2 = j(C+1)$ for $j=0, 1, 2, \ldots, C-1$, the logical access address data described by a starting block address, n, and a logical block length parameter, N, indicating the number of contiguous blocks to be accessed, and producing an intermediate set of logical channel indices, $\{m_i\}$, a final set of logical channel indices $\{m_i'\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the translation means comprises means for:

(a) defining a modified channel parameter, C', and a modified rank parameter R', satisfying the following conditions:

$$C' = C \cdot R$$

and $$R' = 1;$$

(b) defining a modified logical block address index, n', and a modified length index, N', satisfying the following conditions:

$$n' = n + P(n)$$

and $$N' = N + P(n+N-1) - P(n),$$

where $$P(n) = C \lfloor \frac{n}{C(C-1)} \rfloor + \lfloor \frac{n \bmod C(C-1)}{C} \rfloor + 1$$

(c) mapping the modified logical block address information given as the logical starting block, n', and the number of contiguous blocks to be accessed, N', into an intermediate set of logical channel indices, $\{m_i\}$, by use of the following relationship:

$$m_i = (n'+i) \bmod C',$$

where $0 \leq i \leq C'-1$ is an index representing the order of accessing the channel corresponding to the value of $m_i$;

(d) identifying the logical drive, $D_{mi,0}$, on each channel involved in the access, the coordinate parameters ($m_i$, 0), satisfying the following conditions:

$$0 \leq (n'+i)/C' \leq B_0,$$

where $B_0$ is the number of blocks each logical drive;

(e) computing a set of starting logical drive block addresses for the logical drive, $D_{mi,0}$, on each channel, $\{s_{mi}(0)\}$, as follows:

$$s_{mi}(0) = (((n'+i)-m_i)/C') \cdot B_0;$$

(f) computing the number of blocks to be accessed, $x_i(0)$, for each logical drive, $D_{mi,0}$, as follows:

$$x_i(0) = \min\{\lfloor N'/C' \rfloor + \sigma((N' \bmod C') - i), B_0 - s_{mi}(0)\},$$

where $\sigma(\cdot) = 1$ for $((N' \bmod C') - i) > 0$, and $\sigma(\cdot) = 0$ otherwise;

(g) computing a new modified set of channel parameters, $\{m_i'\}$, and a modified set of rank parameters, $\{p_i'\}$, satisfying the following conditions:

$$m_i' = m_i \bmod C$$

and $$p_i' = \lfloor m_i/C \rfloor;$$

(h) executing a user specified mapping of logical channel and logical rank to physical channel and physical rank of logical drive, $D_{m_i',p_i',40}$, to determine physical rank and physical channel; and (i) adding the physical address of the logical drive's block number 0 to the logical starting block address, $s_i(j)$, of each logical drive to determine physical starting block address.

13. The system of claim 1 wherein the translation means is for accommodating an array of C logical data channels, using a two dimensional block striping RAID-2D4 format, the logical access address data described by a starting block address, n, and a logical block length parameter, N, indicating the number of contiguous blocks to be accessed, and producing an intermediate set of logical channel indices, $\{m_i\}$, a final set of logical channel indices, $\{m_i'\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the translation means comprises means for:

(a) defining a modified channel parameter, C', and a modified rank parameter R', satisfying the following conditions:

$$C' = C \cdot R$$

and $$R' = 1;$$

(b) mapping the logical block address information given as the logical starting block, n, and the number of contiguous blocks, N, to be accessed into an intermediate set of logical channel indices, $\{m_i\}$, by use of the following relationship:

$$m_i = (n+i) \bmod C',$$

where $0 \leq i \leq C'-1$ is an index representing the order of accessing the channel corresponding to the value of $m_i$;

(c) identifying the logical drive, $D_{mi,0}$, on each channel involved in the access, the coordinate parameters ($m_i$, o), satisfying the following conditions:

$$0 \leq (n+i)/C' \leq B_0,$$

where $B_0$ is the number of blocks in each logical drive;

(d) computing a set of starting logical drive block addresses for the first logical drive, $D_{mi,0}$, on each channel, $\{s_{mi}(0)\}$, as follows:

$$s_{mi}(0) = (((n+i)-m_i)/C') - B_0;$$

(e) computing the number of blocks to be accessed, $x_i(0)$, for each logical drive, $D_{mi,0}$, as follows:

$$x_i(0) = \min\{\lfloor N/C' \rfloor + \sigma((N \bmod C')-i), B_0 - s_{mi}(0)\},$$

where $\sigma(\cdot) = 1$ for $((N \bmod C')-i) > 0$, and $\sigma(\cdot) = 0$ otherwise;

(f) computing a new modified set of channel parameters, $\{m_i'\}$, and a modified set of rank parameters, $\{p_i'\}$, satisfying the following conditions:

$$m_i' = m_i \bmod C$$

and $$p_i' = \lfloor m_i/C \rfloor;$$

(g) executing a user specified mapping of logical channel and logical rank to physical channel and physical rank of logical drive, $D_{m_k', p_k'}$, to determine physical rank and physical channel; and (h) adding the physical address of the logical drive's block number 0 to the logical starting block address, $s_i(j)$, of each logical drive to determine physical starting block address.

14. The system of claim 1 further comprising scheduling means, controlled by the scheduling program, for determining a sequence for executing a general set of host access requests to the memory array, the sequence including parallel execution of the queued set of memory array access requests.

15. The system of claim 14 wherein the scheduling means operates on a prescribed cost function, D, representative of the latency for all possible parallel and sequential orders of accessing the queued set of m host system access requests to the memory array, the queued set indexed 1,2, ..., m, the order of access ensuring a bounded latency for all queued host system access requests by maintaining a count of the number of times a particular access request has been rescheduled without execution, the prescribed cost function being $$D = \sum_{i=0}^{m-1} \sum_{j=1}^{m} a_i^T \cdot a_j |n_i + N_i - n_j| 2^{-adj} x_{ij},$$

where $a_k$ is a resource vector of dimensions C×1, with each vector element corresponding to a specific physical channel, each vector element value being a 1 if the corresponding physical channel of the $k^{th}$ queued access request is being used for the access, and a 0 if the corresponding channel is not being used, $n_0 + N_0$ is an initial address corresponding to a last address used to access memory, $n_k$ is a memory array address to the $k^{th}$ queued memory access request, $N_k$ is a memory array block size of the $k^{th}$ queued memory access request, $x_{ij}$ is a binary valued coefficient, $\{0,1\}$, which indicates that an $i^{th}$ queued memory access is followed by a $j^{th}$ queued memory access when $x_{ij} = 1$, and $2^{-adj}$ is a binary parameter scaling factor in which $d_j$ is a count of the number of times the $j^{th}$ access request has been rescheduled without execution and a is a constant scaling parameter, the scheduling means comprising means for:

(a) forming a resource vector set $\{a_k\}$;

(b) counting the number of times each of the access requests has been rescheduled without execution in order to form a set of counts $\{d_j\}$;

(c) minimizing the cost function D subject to a set of conditions as follows:

$$\sum_{i=0}^{m-1} x_{ij} = 1, \text{ for } j = 1, 2, \ldots, m,$$

$$\sum_{j=1}^{m} x_{ij} = 1, \text{ for } i = 0, 1, 2, \ldots, m-1,$$

$$x_{ij} \in \{0, 1\},$$

and $$x_{ij} = 0 \text{ for } i = j;$$

(d) ordering the set of m, $\{x_{ij}\}$, obtained from the means for minimizing cost function D, beginning with $x_{0b1}$, and proceeding to the right as follows:

$$x_{0b1} \ x_{b1b2} \ x_{b2b3} \ldots x_{bm-1bm},$$

so that each $j^{th}$ index of each coefficient, $x_{ij}$, becomes an $i^{th}$ index of a next right adjacent coefficient;

(e) arranging the order of b-subscripts of the m coefficients in ascending order, $b_1\ b_2\ b_3\ \ldots\ b_m$, for scheduling an optimal sequence of the m queued access requests indexed $1, 2, \ldots, m$, so that, by following the order of subscripts, the optimal sequence for accessing yields a strictly sequential accessing order that has a minimum latency relative to any other sequential accessing order; and (f) sorting the requests in the memory access queue in the minimum latency order obtained from means (e).

16. The system of claim 15 wherein the means for minimizing cost function D uses linear programming simplex methods.

17. The system of claim 15 further comprising means for scheduling parallel access that comprises means for:

(g) determining channel bus resource usage of the queued requests; and (h) accessing the memory array in accordance with the order of the memory access obtained by means (f).

18. A method for translating logical access address data to a logical and physical drive access address data set for a logical array of bulk memories having C logical data channels, one parity channel, and a plurality of logical rank levels, the array using a RAID-4 block striping data format, the logical access address data described by a starting block address, n, and a block length parameter, N, indicating the number of contiguous blocks to be accessed, and producing a set of channel indices, $\{m_i\}$, a set of channel starting addresses, $\{s_{mi}(j)\}$, and a set of channel transfer length parameters, $\{x_i(j)\}$, indicating the length of access for each rank, $p_j$, involved in the access for each channel, for producing an optimal set of logical drive access addresses requiring a minimal set of access commands, the method comprises:

(a) mapping the logical block address information given as the logical starting block, n, and the number of contiguous blocks, N, to be accessed into a set of logical channel indices, $\{m_i\}$, by use of the following relationship:

$$m_i = (n+i) \bmod C,$$

where $0 \leq i \leq C-1$ is an index representing the order of accessing the channel corresponding to the value of $m_i$;

(b) identifying the first logical drive, $D_{mi,pi}$, on each channel involved in the access, the coordinate parameters $(m_i, p_i)$, satisfying the following conditions:

$$M_{pi} \leq (n+i)/C \leq M_{pi+1},$$

where $M_{pi} = \Sigma_{j=0}^{pi-1} B_j$, $p_i$ is a logical rank index, and $B_j$ is the number of blocks in rank j logical drive;

(c) computing a set of starting logical drive block addresses for the first logical drive, $D_{mi,pi}$, on each channel, $\{s_{mi}(0)\}$, as follows:

$$s_{mi}(0) = (((n+i) - m_i)/C) - M_{pi};$$

(d) computing the number of blocks to be accessed, $x_i(0)$, for each logical drive, $D_{mi,pi}$, as follows:

$$x_i(0) = \min\{\lfloor N/C \rfloor + \sigma((N \bmod C) - i), B_{pi} - s_{mi}(0)\},$$

where $\sigma(\cdot) = 1$ for $((N \bmod C) - i) > 0$, and $\sigma(\cdot) = 0$ otherwise;

(e) testing to determine if additional higher logical ranks are involved in the access by evaluating if:

$$x_i(0) < \lfloor N/C \rfloor + \sigma((N \bmod C) - i);$$

(f) setting the starting logical drive block address in logical drive $D_{mi,pi+1}$, $s_{mi}(1) = 0$, if $x_i(0)$ satisfies the condition of step (e);

(g) computing the number of data blocks in logical drive $D_{mi,pi+1}$, $x_1(1)$, if $x_i(0)$ satisfies the condition of step (e), using the following expression:

$$x_i(1) = \max\{0, \min\{\lfloor N/C \rfloor + \sigma((N \bmod C) - i) - x_i(0), B_{(pi+1)}\}\};$$

(h) testing to determine if additional higher logical ranks are involved in the access by evaluating if $x_i(j) > 0$, where $$x_i(j) = \max\{0, \min\{\lfloor N/C \rfloor + \sigma((N \bmod C) - i) - \sum_{k=0}^{j-1} x_i(0), B_{(pi+1)}\}\};$$

so that if $x_i(j) > 0$, $x_i(j)$ represents the number of blocks in logical drive $D_{mi,pi+j}$ involved in the access and $s_{mi}(j) = 0$ represents the starting logical drive block address;

(i) executing a user specified mapping of logical channel and logical rank to physical channel and physical rank of logical drive, to determine physical rank and physical channel; and (j) adding a physical address of the logical drive's block number 0 to the logical starting block address, $s_{mi}(j)$ to determine a physical starting block address.

19. A method for translating logical address access data to a logical and physical drive access data set, for accommodating an array of C logical data channels using a RAID-1 partitioned mirrored data format, the logical access address data described by a starting block address, n, and a logical block length parameter, N, indicating the number of contiguous blocks to be accessed, and producing a set of channel indices, $\{m_i\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical drive access address data requiring a minimal set of access commands, the partitioned memory having a first set of channel and rank coordinates, (m,p), for a first partitioned section of memory, and a second set (m', p') for a second partitioned section of memory, the translation method comprising:

(a) mapping the logical block address information given as the logical starting block, n, and the number of contiguous blocks, N, to be accessed into a set of logical channel indices, $\{m_i\}$, by use of the following relationship:

$$m_i = (n+i) \bmod C,$$

where $0 \leq i \leq C-1$ is an index representing the order of accessing the channel corresponding to the value of $m_i$;

(b) identifying the first logical drive, $D_{mi,pi}$, on each channel involved in the access, the coordinate parameters $(m_i, p_i)$, satisfying the following conditions:

$$M_{pi} \leq (n+i)/C \leq M_{pi+1},$$

where $M_{pi} = \Sigma_{j=0}^{pi-1} B_j$, $p_i$ is a logical rank index, and $B_j$ is the number of blocks in a rank j logical drive;

(c) computing a set of starting logical drive block addresses for the first logical drive, $D_{mi,pi}$, on each channel, $\{s_{mi}(0)\}$, as follows:

$$s_{mi}(0)=(((n+i)-m_i)/C)-M_{pi};$$

(d) computing the number of blocks to be accessed, $x_i(0)$, for each logical drive, $D_{mi,pi}$, as follows:

$$x_i(0)=\min\{\lfloor N/C \rfloor + \sigma((N \bmod C)-i), B_{pi}-s_{mi}(0)\},$$

where $\sigma(\cdot)=1$ for $((N \bmod C)-i)>0$, and $\sigma(\cdot)=0$ otherwise;

(e) testing to determine if additional higher logical ranks are involved in the access by evaluating if:

$$x_i(0) < \lfloor N/C \rfloor + \sigma((N \bmod C)-i);$$

(f) setting the starting logical drive block address in logical drive $D_{mi,pi+1}$, $s_{mi}(1)=0$, if $x_i(0)$ satisfies the condition of step (e);

(g) computing the number of data blocks in logical drive $D_{mi,pi+1}$, $x_i(1)$, if $x_i(0)$ satisfies the condition of step (e), using the following expression:

$$x_i(1)=\max\{0,\min\{\lfloor N/C \rfloor + \sigma((N \bmod C)-i)-x_i(0), B_{(pi+1)}\}\};$$

(h) testing to determine if additional higher logical ranks are involved in the access by evaluating if $x_i(j)>0$, where $$x_i(j) = \max\left\{0, \min\left\{\lfloor N/C \rfloor + \sigma((N \bmod C) - i) - \sum_{k=0}^{j-1} x_i(k), B_{(pi+j)}\right\}\right\},$$

so that if $x_i(j)>0$, $x_i(j)$ represents the number of blocks in logical drive $D_{mi,pi+j}$ involved in the access and $s_{mi}(j)=0$ represents the starting logical drive block address;

(i) executing a user specified mapping of logical channel and logical rank to physical channel and physical rank of logical drive, $D_{mk,pk}$, to determine physical rank and physical channel; and (j) adding a physical address of the logical drive's block number 0 to the logical starting block address, $s_{mi}(j)$ to determine a physical starting block address;

and for the second memory section, use means (a)–(j) as indicated above, using coordinate system (m', p').

20. A method for translating logical address access data to a logical and physical drive access data set, for accommodating an array of C logical data channels using a RAID-3 format, the logical access address data described by a starting block address, n, and a logical block length parameter, N, indicating the number of contiguous blocks to be accessed, and for producing a set of logical drive starting addresses, $\{s(j)\}$, and a set of logical drive transfer length parameters, $\{x(j)\}$, indicating the number of contiguous blocks to be accessed at logical ranks, $\{p_j\}$, for each channel, for producing a set of logical drive access address data requiring a minimal set of access commands, the method comprising:

(a) mapping the logical block address information given as the logical starting block, n, and the number of contiguous blocks to be accessed, N, into a rank index $p_0$, that represents the first rank of logical drives involved in the data access and satisfies the condition:

$$M_{p0} \leq n \leq M_{p0+1},$$

where $M_{p0}=\sum_{k=0}^{p0-1} B_k'$, $M_0=0$ and $B_k'$ is the number of blocks in all logical drives in rank k;

(b) computing a starting logical drive block address, $s(0)$, on each channel, as follows:

$$s(0)=n-M_{p0};$$

(c) computing the number of blocks to be accessed, $x(0)$, for each channel as follows:

$$x(0)=\min\{N, B_p-s(0)\};$$

(d) testing to determine if additional higher logical ranks are involved in the access by evaluating if:

$$x(0)<N,$$

which, if satisfied, indicates that the rank $p_0+1$ logical drives are involved with starting addresses of $s(1)=0$;

(e) computing the number of data blocks to be accessed in each logical drive, if $x(0)$ satisfies the condition of step (d), by:

$$x(1)=\max\{0,\min\{(N-x(0)), B_{(p0+1)}\}\};$$

(f) testing to determine if additional higher logical ranks are involved in the access by evaluating if $x(j)>0$, where $$x(j) = \max\left\{0, \min\left\{\left(N - \sum_{k=0}^{j-1} x(k)\right), B_{(p_o+j)}\right\}\right\},$$

so that if $x(j)>0$, $x(j)$ represents the number of blocks, beginning at address $s(j)=0$, in all memory units of rank $p_j=p_0+j$;

(g) executing a user specified mapping of logical channel and logical rank to physical channel and physical rank of logical drive, $D_{mk,pk}$, to determine physical rank and physical channel; and (h) adding the physical address of the logical drive's block number 0 to the logical starting block address, $s(k)$ to determine physical starting block address.

21. A method for translating logical address access data to a logical and physical drive access data set, for accommodating an array of C logical data channels using a RAID-5 block striping format with distributed parity for allowing parallel access operations, the distributed parity blocks located at reserved logical block addresses, $n_j$, where $n_j$ satisfies a constraint condition, $n_j \bmod C^2 = j(C+1)$ for $j=0, 1, 2, \ldots, C-1$, the logical access address data described by a starting block address, n, and a logical block length parameter, N, indicating the number of contiguous blocks to be accessed, and producing a set of channel indices, $\{m_i\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the method comprising:

(a) defining a modified logical block address index, n', and a modified length index, N', satisfying the following conditions:

$n'=n+P(n)$ and $N'=N+P(n+N-1)-P(n)$, where $$P(n) = C \lfloor \frac{n}{C(C-1)} \rfloor + \lfloor \frac{n \bmod C(C-1)}{C} \rfloor + 1$$

(b) mapping the modified logical block address information given as the logical starting block, n', and the number of contiguous blocks to be accessed, N', into a set of logical channel indices, $\{m_i\}$, by use of the following relationship:

$m_i = (n'+i) \bmod C$, where $0 \leq i \leq C-1$ is an index representing the order of accessing the channel corresponding to the value of $m_i$;

(c) identifying the first logical drive, $D_{mi,pi}$, on each channel involved in the access, the coordinate parameters $(m_i, p_i)$, satisfying the following conditions:

$M_{pi} \leq (n'+i)/C \leq M_{pi+1}$, where $M_{pi} = \Sigma_{j=0}^{pi-1} B_j$, $p_i$ is a logical rank index, and $B_j$ is the number of blocks in a rank j logical drive;

(d) computing a set of starting logical drive block addresses for the first logical drive, $D_{mi,pi}$, on each channel, $\{s_{mi}(0)\}$, as follows:

$s_{mi}(0) = (((n'+i)-m_i)/C) - M_{pi}$;

(e) computing the number of blocks to be accessed, $x_i(0)$, for each logical drive, $D_{mi,pi}$, as follows:

$x_i(0) = \min\{\lfloor N'/C \rfloor + \sigma((N' \bmod C)-i), B_{pi}-s_{mi}(0)\}$, where $\sigma(\cdot)=1$ for $((N' \bmod C)-i)>0$, and $\sigma(\cdot)=0$ otherwise.

(f) testing to determine if additional higher logical ranks are involved in the access by evaluating if:

$x_i(0) < \lfloor N'/C \rfloor + \sigma((N' \bmod C)-i)$;

(g) setting the starting logical drive block address in logical drive $D_{mi,pi+1}$, $s_{mi}(1)=0$;

(h) computing the number of data blocks in logical drive $D_{mi,pi+1}$, $x_i(1)$, if $x_i(0)$ satisfies the condition of step (f), using the following expression:

$x_i(1) = \max\{0, \min\{\lfloor N'/C \rfloor + \sigma((N' \bmod C)-i)-x_i(0), B_{pi+1}\}\}$;

(i) testing to determine if additional higher logical ranks are involved the access by evaluating if $x_i(j)>0$, where $x_i(j) = \max 0, \min \lfloor N'/C \rfloor + \sigma((N' \bmod C) - i) -$ -continued $$\sum_{k=0}^{j-1} x_i(k), B_{(pi+j)} \} \},$$

so that if $x_i(j)>0$, $x_i(j)$ represents the number of blocks in logical drive $D_{mi,pi+j}$ involved in the access and $s_{mi}(j)=0$ represents the starting logical drive block address;

(j) executing a user specified mapping of logical channel and logical rank to physical channel and physical rank of logical drive, $D_{mk,pk}$, to determine physical rank and physical channel; and (k) adding the physical address of the logical drive's block number 0 to the logical starting block address, $s_i(j)$, to determine physical starting block address.

22. The method of claim 21 further comprising a step for determining that block $k_i$ of drive $D_{mi,pi}$ is a parity block, the step comprising testing if the following expression is true:

$(C(M_{pi}+k)+m_i) \bmod C^2 = m_i(C+1)$, and, if true, block $k_i$ is a parity block.

23. A method for translating logical address access data to a logical and physical drive access data set, for accommodating an array of C logical data channels, using a two dimensional RAID-2D5 block striping format with distributed parity for allowing parallel access operations, the distributed parity blocks located at reserved logical block addresses, $n_j$, where $n_j$ satisfies a constraint condition, $n_j \bmod C^2 = j(C+1)$ for $j=0, 1, 2, \ldots, C-1$, the logical access address data described by a starting block address, n, and a logical block length parameter, N, indicating the number of contiguous blocks to be accessed, and producing an intermediate set of logical channel indices, $\{m_i\}$, a final set of logical channel indices $\{m_i'\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the translation method comprising:

(a) defining a modified channel parameter, C', and a modified rank parameter R', satisfying the following conditions:

$C' = C \cdot R$ and $R' = 1$;

(b) defining a modified logical block address index, n', and a modified length index, N', satisfying the following conditions:

$n' = n + P(n)$ and $N' = N + P(n+N-1) - P(n)$, where $$P(n) = C\lfloor \frac{n}{C(C-1)} \rfloor + \lfloor \frac{n \bmod C(C-1)}{C} \rfloor + 1$$

(c) mapping the modified logical block address information given as the logical starting block, n', and the number of contiguous blocks to be accessed, N', into an intermediate set of logical channel indices, $\{m_i\}$, by use of the following relationship:

$m_i = (n'+i) \bmod C'$, where $0 \leq i \leq C'-1$ is an index representing the order of accessing the channel corresponding to the value of $m_i$;

(d) identifying the logical drive, $D_{mi,0}$, on each channel involved in the access, the coordinate parameters ($m_i$, 0), satisfying the following conditions:

$0 \leq (n'+i)/C' \leq B_0$, where $B_0$ is the number of blocks each logical drive;

(e) computing a set of starting logical drive block addresses for the logical drive, $D_{mi,0}$, on each channel, $\{s_{mi}(0)\}$, as follows:

$s_{mi}(0) = (((n'+i) - m_i)/C') - B_0$;

(f) computing the number of blocks to be accessed, $x_i(0)$, for each logical drive, $D_{mi,0}$, as follows:

$x_i(0) = \min\{\lfloor N'/C' \rfloor + \sigma((N' \bmod C') - i), B_0 - s_{mi}(0)\}$, where $\sigma(\cdot) = 1$ for $((N' \bmod C') - i) > 0$, and $\sigma(\cdot) = 0$ otherwise;

(g) computing a new modified set of channel parameters, $\{m_i'\}$, and a modified set of rank parameters, $\{p_i'\}$, satisfying the following conditions:

$m_i' = m_i \bmod C$ and $p_i' = \lfloor m_i/C \rfloor$;

(h) executing a user specified mapping of logical channel and logical rank to physical channel and physical rank of logical drive, $D_{m_k',p_k'}$, to determine physical rank and physical channel; and (i) adding the physical address of the logical drive's block number 0 to the logical starting block address, $s_i(j)$, of each logical drive to determine physical starting block address.

24. A method for translating logical address access data to a logical and physical drive access data set, for accommodating an array of C logical data channels, using a two dimensional block striping RAID-2D4 format, the logical access address data described by a starting block address, n, and a logical block length parameter, N, indicating the number of contiguous blocks to be accessed, and producing an intermediate set of logical channel indices, $\{m_i\}$, a final set of logical channel indices, $\{m_i'\}$, a set of logical drive starting addresses, $\{s_{mi}(j)\}$, and a set of logical drive transfer length parameters, $\{x_i(j)\}$, indicating the number of contiguous blocks to be accessed for each logical rank, $p_j$, for each channel, for producing a set of logical access address data requiring a minimal set of access commands, the translation method comprising:

(a) defining a modified channel parameter, C', and a modified rank parameter R', satisfying the following conditions:

$C' = C \cdot R$ and $R' = 1$;

(b) mapping the logical block address information given as the logical starting block, n, and the number of contiguous blocks, N, to be accessed into an intermediate set of logical channel indices, $\{m_i\}$, by use of the following relationship:

$m_i = (n+i) \bmod C'$, where $0 \leq i \leq C'-1$ is an index representing the order of accessing the channel corresponding to the value of $m_i$;

(c) identifying the logical drive, $D_{mi,0}$, on each channel involved in the access, the coordinate parameters ($m_i$, 0), satisfying the following conditions:

$0 \leq (n+i)/C' \leq B_0$, where $B_0$ is the number of blocks in each logical drive;

(d) computing a set of starting logical drive block addresses for the first logical drive, $D_{mi,0}$, on each channel, $\{s_{mi}(0)\}$, as follows:

$s_{mi}(0) = (((n+i) - m_i)/C') - B_0$;

(e) computing the number of blocks to be accessed, $x_i(0)$, for each logical drive, $D_{mi,0}$, as follows:

$x_i(0) = \min\{\lfloor N/C' \rfloor + \sigma((N \bmod C') - i), B_0 - s_{mi}(0)\}$, where $\sigma(\cdot) = 1$ for $((N \bmod C') - i) > 0$, and $\sigma(\cdot) = 0$ otherwise;

(f) computing a new modified set of channel parameters, $\{m_i'56\}$, and a modified set of rank parameters, $\{p_i'\}$, satisfying the following conditions:

$m_i' = m_i \bmod C$ and $p_i' = \lfloor m_i/C \rfloor$;

(g) executing a user specified mapping of logical channel and logical rank to physical channel and physical rank of logical drive, $D_{m_k',p_k'}$, to determine physical rank and physical channel; and (h) adding the physical address of the logical drive's block number 0 to the logical starting block address, $s_i(j)$, of each logical drive to determine physical starting block address.

25. A method for accessing a memory array of C physical channels that reduces latency by optimizing parallel access to a memory array of discrete bulk memory units organized by physical channel index and physical rank index, wherein bulk memory units with the same rank are of a similar type, and bulk memory units with the same channel index share a common channel data bus, the method comprising:

(a) receiving an outside request for array memory access, the access identified by a logical memory address and data block length;

(b) converting logical addresses to physical addresses;

(c) forming a memory access queue of all requests received but not executed;

(d) computing the minimum latency order of accessing the queued requests as follows:

(i) prescribing a cost function, D, representative of the latency for all possible sequential orders of accessing the queued set of m host access requests to the memory array, where $$D = \sum_{i=0}^{m-1} \sum_{j=1}^{m} a_i^T \cdot a_j |n_i + N_i - n_j| 2^{-ad_j} x_{ij},$$

$a_k$ is a C×1 resource vector for queued request k with binary elements (0, 1), where a 1 indicates that a particular memory array channel is used by queued request k, $n_0+N_0$ is an initial address corresponding to a last array logical address used to access memory, $n_k$ is a memory array logical address to the $k^{th}$ queued memory access request, $N_k$ is a memory array block size of the $k^{th}$ queued memory access request, $x_{ij}$ is a binary valued coefficient, {0,1}, which indicates that an $i^{th}$ queued memory access is followed by a $j^{th}$ queued memory access when $x_{ij}=1$, and $2^{-adj}$ is a binary parameter scaling factor in which $d_j$ is a count of the number of time the $j^{th}$ access request has been rescheduled without execution and a is a constant scaling parameter, (ii) minimizing cost function D subject to a set of conditions as follows:

$$\sum_{i=0}^{m-1} x_{ij} = 1, \text{ for } j = 1, 2, \ldots, m,$$

$$\sum_{j=1}^{m} x_{ij} = 1, \text{ for } i = 0, 1, 2, \ldots, m-1,$$

$x_{ij} \in \{0, 1\}$, and $x_{ij} = 0$ for $i = j$;

(iii) ordering the set of m coefficients, $\{x_{ij}\}$, obtained in step (d)(ii), beginning with $x_{0b1}$, and proceeding to the right as follows:

$$x_{0b1} \ x_{b1b2} \ x_{b2b3} \ \ldots \ x_{bm-1bm},$$

so that each $j^{th}$ index of each coefficient, $x_{ij}$, becomes an $i^{tk}$ index of a next right adjacent coefficient, (iv) arranging the order of b-subscripts of the m coefficients in ascending order, $b_1 \ b_2 \ b_3 \ \ldots \ b_m$, for indicating the left to right sequence for ordering the m queued access requests indexed 1, 2, ..., m, so that, by following the order of subscripts, an optimized sequence for accessing yields an access sequence with minimum latency;

(e) sorting the requests in the memory access queue in the minimum latency order obtained in step (d); and (f) accessing the memory array in accordance with the order of the memory access queue of step (e).

26. The method of claim 25 wherein the step of minimizing the performance function, D, is by use of linear programming simplex methods.

* * * * *